United States Patent
Song et al.

(10) Patent No.: US 11,451,215 B1
(45) Date of Patent: Sep. 20, 2022

(54) LOW POWER HIGH PRECISION PIECEWISE LINEAR (PWL) WAVEFORM GENERATOR

(71) Applicant: Cirrus Logic International Semiconductor Ltd., Edinburgh (GB)

(72) Inventors: Miao Song, Austin, TX (US); Xin Zhao, Austin, TX (US); Tejasvi Das, Austin, TX (US); Jason Wardlaw, Austin, TX (US); Michael A. Kost, Cedar Park, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/343,084

(22) Filed: Jun. 9, 2021

(51) Int. Cl.
*H03K 3/011* (2006.01)
*H03K 4/08* (2006.01)
*G06F 1/04* (2006.01)

(52) U.S. Cl.
CPC .............. *H03K 3/011* (2013.01); *H03K 4/08* (2013.01); *G06F 1/04* (2013.01)

(58) Field of Classification Search
CPC ...... H03K 17/14; H03K 17/145; H03K 17/04; H03K 17/00; H03K 17/002; H03K 17/005; H03K 4/00; H03K 4/04; H03K 4/06; H03K 4/063; H04K 4/08; H04K 4/48; H04K 4/50

USPC ................. 327/108–112, 131, 132, 137, 138
See application file for complete search history.

(56) References Cited

U.S. PATENT DOCUMENTS

| | | | |
|---|---|---|---|
| 10,715,121 B2 | 7/2020 | Singh et al. | |
| 2005/0122141 A1* | 6/2005 | Balhiser | H03K 19/01707 327/112 |
| 2021/0305973 A1* | 9/2021 | Chen | H03K 5/02 |

\* cited by examiner

Primary Examiner — Tomi Skibinski
(74) Attorney, Agent, or Firm — E. Alan Davis; Huffman Law Group, PC

(57) ABSTRACT

A piece-wise linear (PWL) waveform generator includes a current generator that generates a reference current, an output capacitor across which an output voltage is developed to form a PWL waveform, charging and discharging current sources for charging/discharging the output capacitor based on the reference current, a clock-controlled switch network for controlling the charging/discharging of the output capacitor, and a feedback control loop that senses the output voltage and controls the current generator to vary the reference current based on the output voltage. A first switch controlled by a first clock signal periodically connects/disconnects a current source output to/from a load impedance and a second switch controlled by a second clock signal periodically connects/disconnects a capacitor to/from the current source while disconnected from the load impedance. The capacitor capacitance is based on a predetermined voltage to mitigate glitching when the first switch connects the current source output to the load impedance.

28 Claims, 13 Drawing Sheets

LOW POWER HIGH PRECISION PIECEWISE LINEAR (PWL) WAVEFORM GENERATOR

BACKGROUND

Devices, including without limitation personal audio devices, wireless telephones, such as mobile/cellular telephones, cordless telephones, mp3 players, and other consumer audio devices, may require generation of periodic waveforms. It may be beneficial to generate the periodic waveforms in a piecewise linear fashion, particularly in a precise manner, with low power consumption, and in a manner that is immune to variation in temperature, process, voltage, frequency and output load.

SUMMARY

In one embodiment, the present disclosure provides a piece-wise linear (PWL) waveform generator that includes a current generator that generates a reference current, an output capacitor across which an output voltage is developed to form the PWL waveform, charging and discharging current sources for charging/discharging the output capacitor based on the reference current, a clock-controlled switch network connected to the current sources and to the output capacitor for controlling the charging/discharging the output capacitor, and a feedback control loop that senses the output voltage and controls the current generator to vary the reference current based on the output voltage.

In another embodiment, the present disclosure provides a method for generating a piece-wise linear (PWL) waveform. The method includes generating a reference current, charging and discharging an output capacitor, based on the reference current, to develop an output voltage to form the PWL waveform, using a clock-controlled switch network connected to the current sources and to the output capacitor to control the charging/discharging of the output capacitor, and using a feedback control loop to sense the output voltage and to control the current generator to vary the reference current based on the output voltage.

In yet another embodiment, the present disclosure provides an auxiliary capacitor path for use in a current steering circuit having a current source that drives a load impedance. The auxiliary capacitor path includes a first switch controlled by a first clock signal to periodically connect and disconnect an output of the current source to and from the load impedance, a capacitor, and a second switch controlled by a second clock signal to periodically connect and disconnect the capacitor to and from the output of the current source while the current source is respectively disconnected from and connected to the load impedance. The capacitor has a capacitance $C=I*T/V$, where I is a predetermined current generated by the current source, T is a time during which the second switch connects the capacitor to the output of the current source according to the second clock signal, and V is a predetermined voltage to which the capacitor is charged by the current source to mitigate glitching of a voltage across the load impedance when the first switch connects the output of the current source to the load impedance according to the first clock signal.

In yet another embodiment, the present disclosure provides a method for use in a current steering circuit having a current source that drives a load impedance. The method includes periodically connecting and disconnecting an output of the current source to and from the load impedance using a first switch controlled by a first clock signal, and periodically connecting and disconnecting an auxiliary capacitor to and from the output of the current source, using a second switch controlled by a second clock signal, while the current source is respectively disconnected from and connected to the load impedance. The auxiliary capacitor has a capacitance $C=I*T/V$, where I is a predetermined current generated by the current source, T is a time during which the second switch connects the auxiliary capacitor to the output of the current source according to the second clock signal, and V is a predetermined voltage to which the auxiliary capacitor is charged by the current source to mitigate glitching of a voltage across the load impedance when the first switch connects the output of the current source to the load impedance according to the first clock signal.

DETAILED DESCRIPTION

Figure 1:
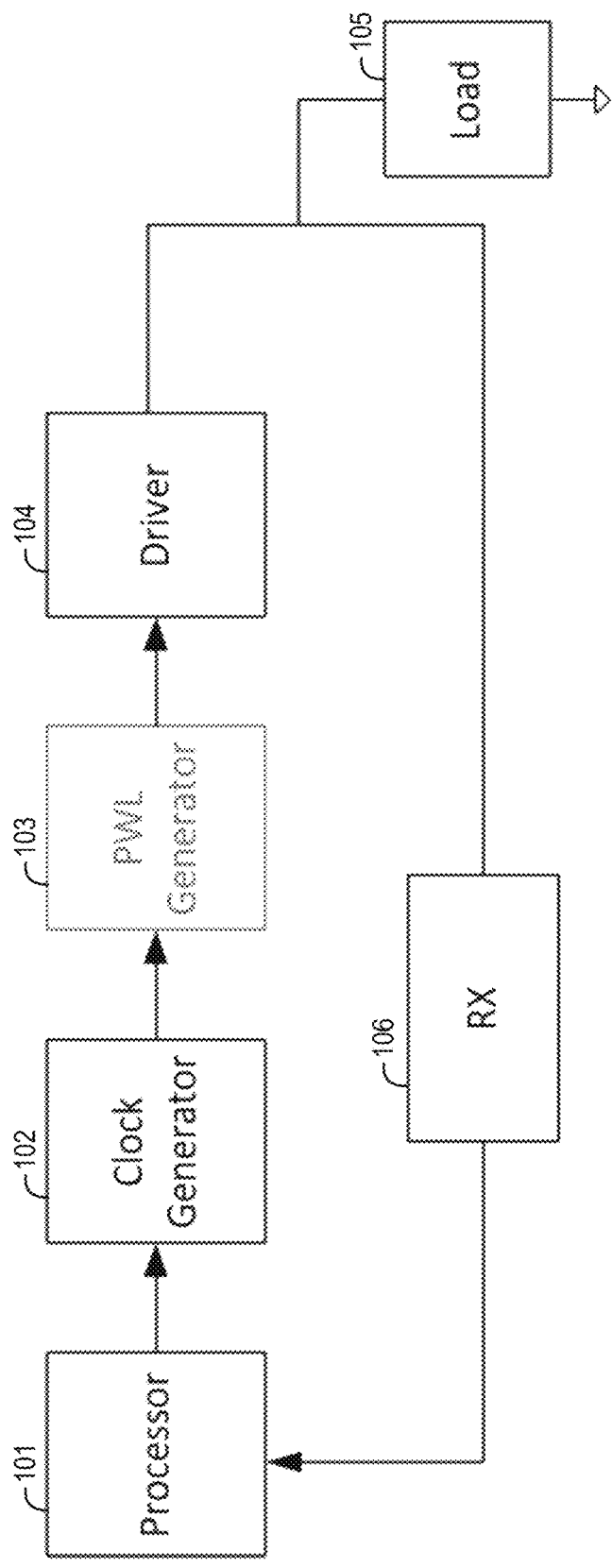
FIG. 1 is an example block diagram of system in accordance with embodiments of the present disclosure.
Figure 4:
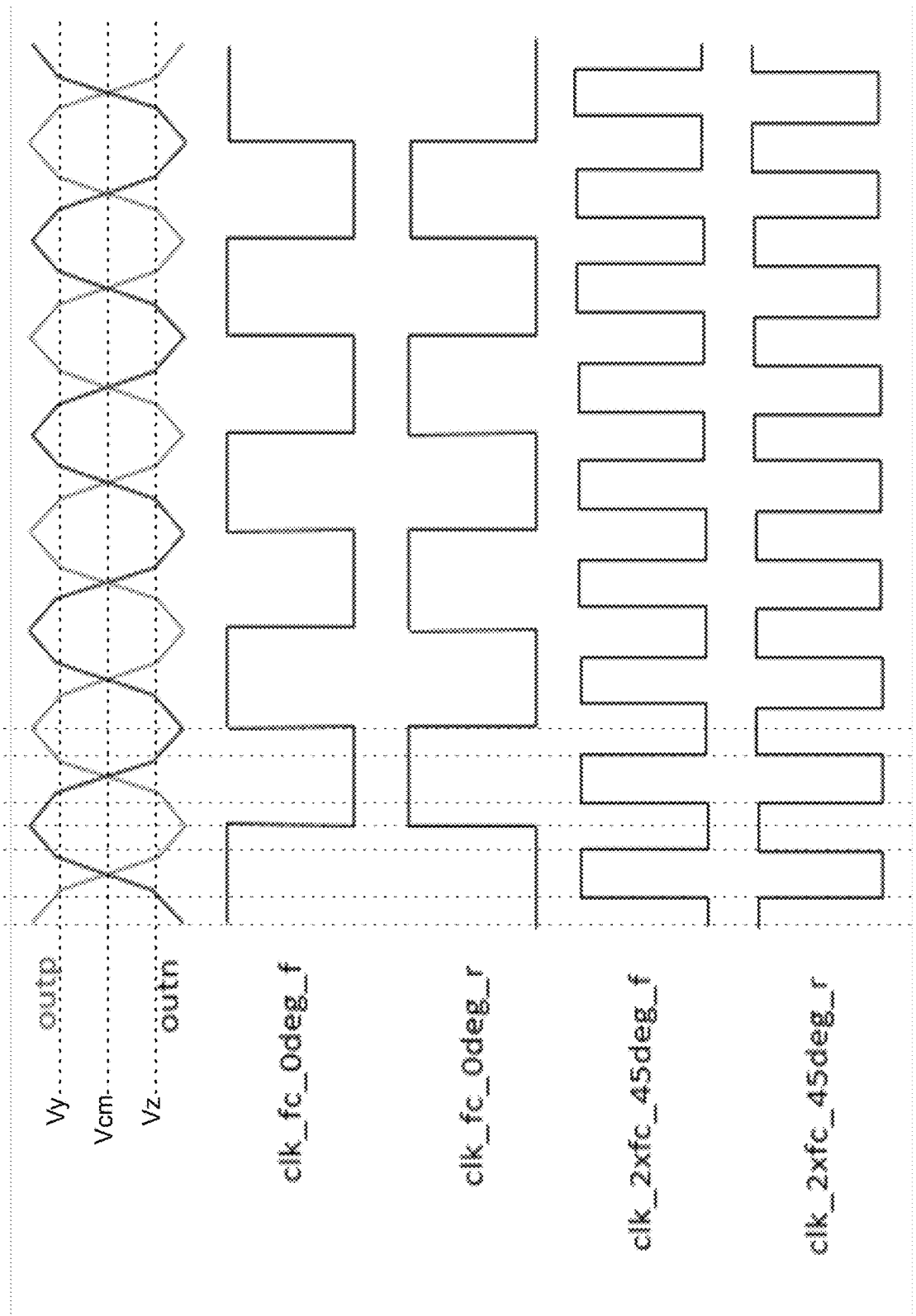
FIG. 4 is an example timing diagram illustrating example control waveforms for switches of switch network of FIG. 3 and illustrating an example PWL pseudo-sinusoidal waveform generated by PWL generator of FIG. 3 in accordance with embodiments of the present disclosure.

FIG. 1 is an example block diagram of system 100 in accordance with embodiments of the present disclosure. The system 100 includes a processor 101, clock generator 102, PWL generator 103, driver 104, load 105 and receive (RX) path 106. The processor 101 may be any type of electronic circuit configured to fetch and execute instructions of a stored program. The processor 101 controls the clock generator 102. The clock generator 102 generates clock signals that are provided to the PWL generator 103, as described in more detail below. The PWL generator 103 generates a piecewise linear (PWL) waveform that is provided to the driver 104. The driver 104 may be any circuit that amplifies and/or filters the PWL waveform input to generate an output at a sufficient level (e.g., voltage and/or current) to drive the load 105. In one embodiment, the driver 104 comprises a transconductor (gm) cell that receives the PWL waveform in the form of a voltage and generates an output current proportional to the input voltage. In one embodiment, PWL waveform approximates a sine wave, i.e., is a pseudo-sinusoidal waveform (e.g., as shown in FIG. 4). In one embodiment, PWL waveform is a triangular waveform. In one embodiment, PWL waveform is a trapezoidal waveform. In one embodiment, PWL waveform is a sawtooth waveform.

The output current driven into the load 105 creates a voltage across the load 105 that is proportional to the impedance of the load 105. The RX path 106 senses the voltage across the load 105 and converts the sensed voltage to a DC value provided to the processor 101. For example, the system 100 may be a human interface LRC detection system such that the load 105 may physically reside under a portion of a device (e.g., button) such that when a user of the device places their finger over the portion of the device, the impedance of the load 105 changes such that operation of the device by the user may be then determined based on the change in the sensed voltage across the load 105. In one embodiment, the change in the sensed voltage may be a change in phase of the voltage.

The load 105 may be any resistive, resistive-capacitive, resistive-inductive, or resistive-capacitive-inductive load. In one embodiment, the load 105 may be a haptic sensor. Embodiments of the PWL generator 103 are described herein that advantageously have the characteristics of low power consumption and high precision. More specifically, aspects of the PWL generator 103 enable the avoidance of glitches when the circuit transitions between the linear sections of the PWL waveform. Additionally, aspects of the PWL generator 103 enable it to achieve robustness or immunity to variations in loading (e.g., of a gm cell connected to the output of the PWL generator 103), temperature, process and frequency, which may have the benefit of reduced calibration/trim circuitry and reduced time during product test. In one embodiment, the PWL generator 103 may be characterized as a transmitter for an inductive sensing circuit.

Transmitting a PWL waveform to a load may accomplish a better result than transmitting a square wave in some applications, such as an inductive sensing application. For example, transmitting a square wave may introduce significant energy in the harmonics of the fundamental frequency that may be eliminated or significantly reduced by transmitting a PWL waveform instead, e.g., a PWL pseudo-sinusoidal waveform may have significantly lower third and fifth harmonics than the square wave. As described below, the PWL waveform may be generated from a set of summed square wave clock signals. In one embodiment, the PWL waveform has a high frequency, e.g., in the 8 MHz to 34 MHz range. In one embodiment, the system 100 is a coherent direct conversion system in that the frequency of the output current driven into the load 105 is the same frequency of the voltage sensed by the receive path 106, and the sensed voltage is directly converted to a DC value provided to the processor 101. Advantageously, the elimination or significant reduction in the energy in the harmonics of the fundamental frequency enables the direct conversion to the DC value that includes primarily the energy at the fundamental frequency rather than at the harmonics, thus providing for a more accurate measurement of sensed value.

Figure 2:
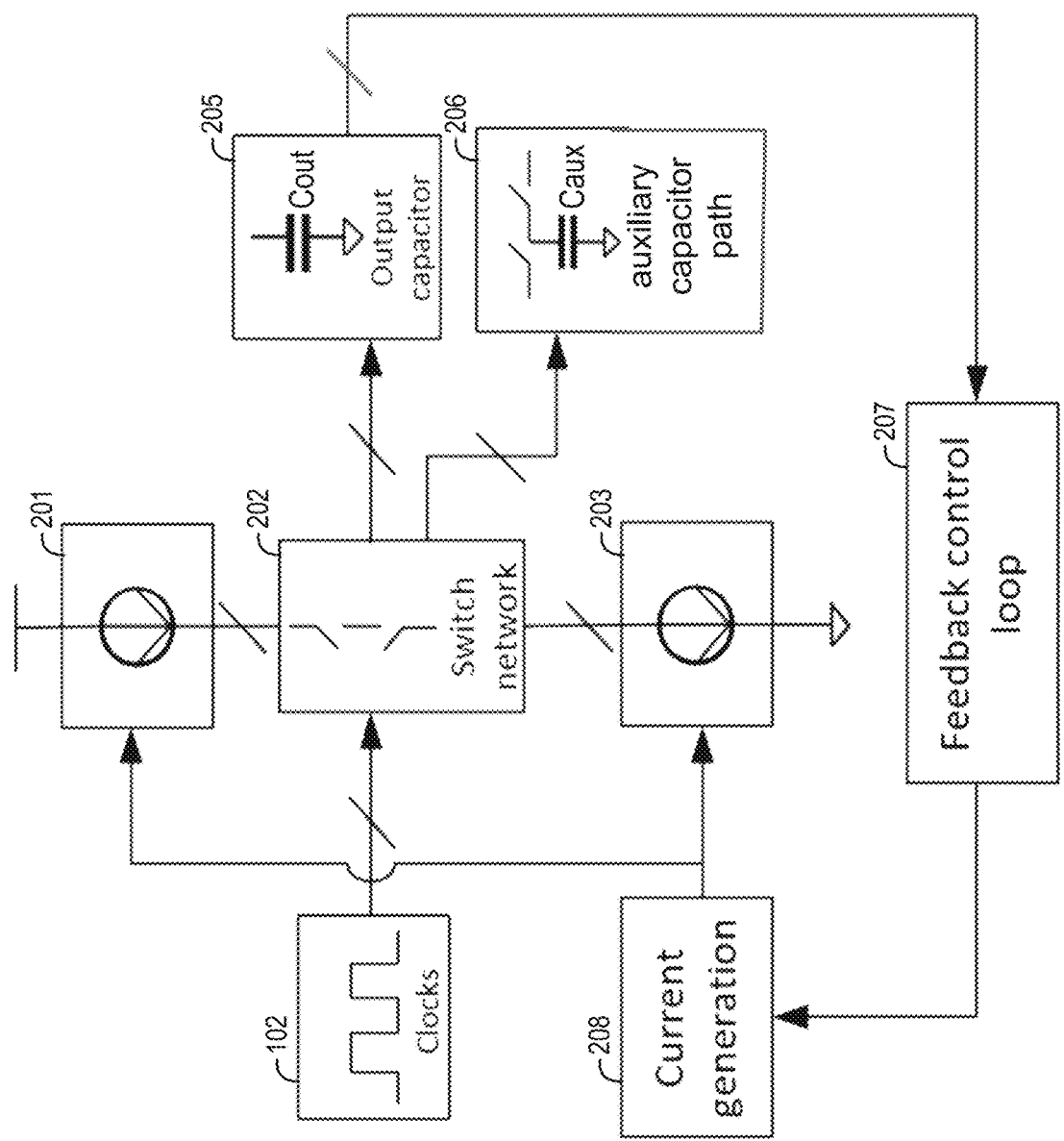
FIG. 2 is an example block diagram of the PWL generator of FIG. 1 in accordance with embodiments of the present disclosure.

FIG. 2 is an example block diagram of the PWL generator 103 of FIG. 1 in accordance with embodiments of the present disclosure. The PWL generator 103 includes a switch network 202 that receives clock signals from the clock generator 102. The switch network 202 is connected to current sources 201 and 203. The current sources 201 and 203 receive currents from a reference current generation circuit 208. The switch network 202 is connected to an output capacitor 205 (e.g., capacitors Coutp and Coutn of FIG. 3) and to an auxiliary capacitor path 206 that includes a capacitor Caux. Current source 201 may be controlled to source current into the output capacitor 205 and current source 203 may be controlled to sink current from the output capacitor 205 to create the PWL waveform output voltage across the output capacitor 205.

The output capacitor 205 provides the output of the PWL generator 103 (e.g., outp and outn of FIGS. 3 through 8), which is also received by a feedback control loop 207. The feedback control loop 207 controls the reference current generation circuit 208 based on the PWL generator 103 output, as described in more detail below. In one embodiment, the current generation circuit 208 comprises a gm cell whose gate is controlled by an output of the feedback control loop 207 to control the current generated by the current generation circuit 208 which may be mirrored to the current sources 201 and 203. The source of the first current source 201 is connected to a voltage source (e.g., supply voltage, e.g., battery), and the source of the second current source 203 is connected to ground.

An auxiliary current path provided by the auxiliary capacitor path 206 may enable the avoidance of glitches between sections of the PWL waveform, as described in more detail below, which may improve the total harmonic distortion (THD) characteristics of the system 100. Furthermore, the feedback control loop 207 (e.g., a switched-capacitor feedback loop, embodiments of which are described with respect to FIGS. 5 through 8) may be used to control a key parameter of the PWL generator 103 to achieve high precision with low power consumption and make it insensitive to capacitive load, temperature, process and frequency variations.

Generally speaking, the current sources 201 and 203 are controlled by different clock phases of the clock signals generated by the clock generator 102 and that control the switches of the switch network 202. Generally, in the examples shown in the disclosure, a switch labeled with a clock signal name is closed when the clock signal is high and open when the clock signal is low. The charging and discharging of the output capacitor 205 by the current sources 201 and 203 generate the PWL waveform, as described in more detail below. The PWL waveform may have minimal low harmonics. In one embodiment, downstream circuits that receive the PWL waveform (e.g., driver 104 and load 105) have limited bandwidth and operate to filter out the higher order harmonics of the PWL waveform.

Figure 3:
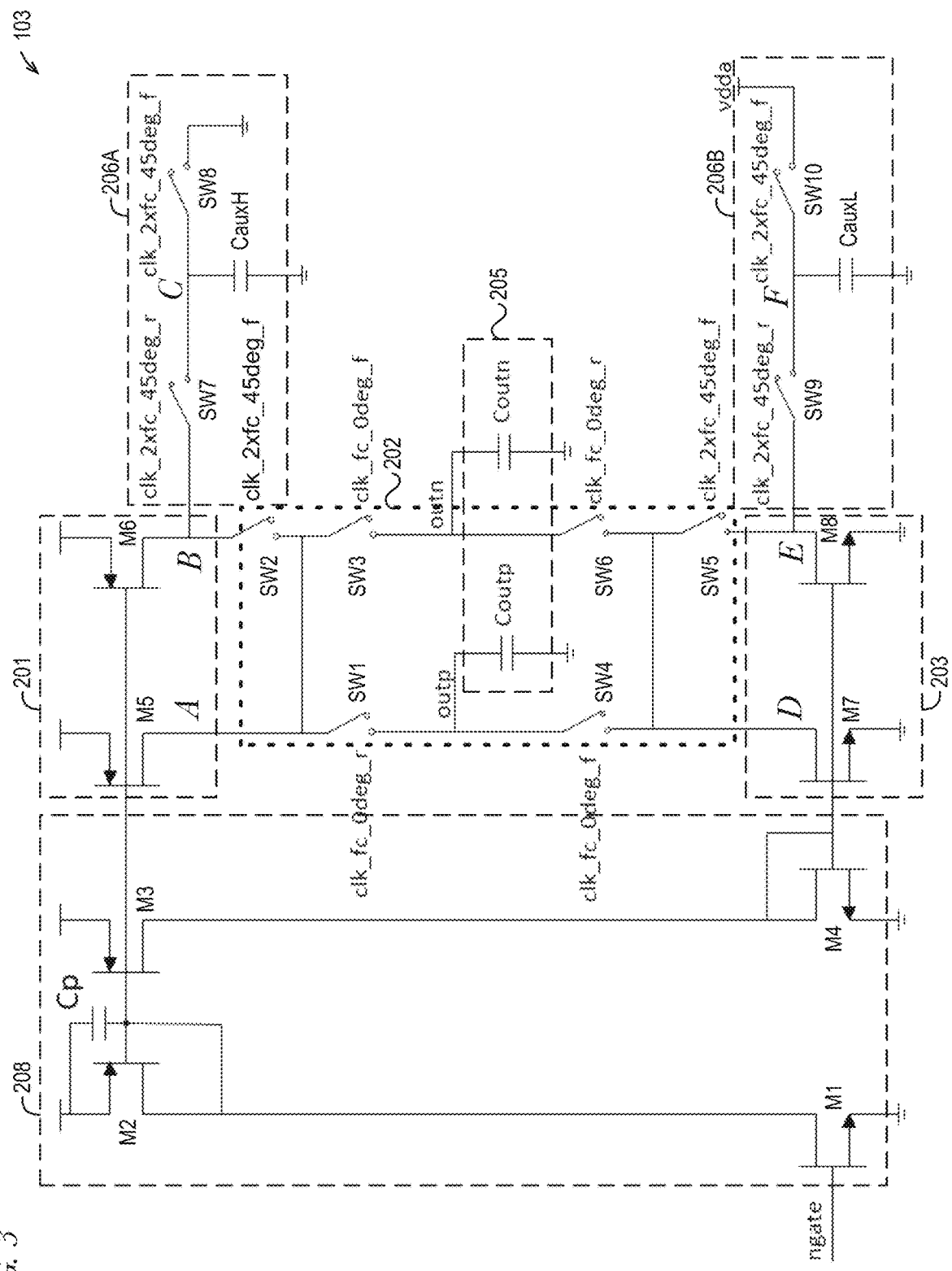
FIG. 3 is an example circuit diagram illustrating the PWL generator of FIG. 1 in accordance with embodiments of the present invention.

FIG. 3 is an example circuit diagram illustrating the PWL generator 103 of FIG. 1 in accordance with embodiments of the present invention. FIG. 3 shows each of the circuits 201, 202, 203, 205, 206 (206A and 206B in FIG. 3) and 208 of the PWL generator 103 of FIG. 2 in more detail, except for the feedback control circuit 207, which is described in more detail with respect to FIGS. 5 through 8. The switch network 202 of FIG. 3 may be operated to generate a PWL pseudo-sinusoidal waveform, as described with respect to and shown in FIG. 4. However, the switch network 202 of FIG. 3 may also be operated in other manners to generate other types of PWL waveforms, such as a PWL triangular waveform, sawtooth waveform, or trapezoidal waveform. The feedback control circuit 207 generates a control signal ngate, as described below, that controls the current generation circuit 208.

The current generation circuit 208 includes an n-type field-effect transistor M1 that receives the ngate control voltage on its gate, whose source is connected to ground and whose drain is connected to the drain of a p-type field-effect transistor M2. Transistor M2 has its source connected to a voltage source (e.g., supply voltage) and its gate connected to its drain. A p-type field-effect transistor M3 has its source connected to the voltage source, its gate connected to the gate of transistor M2, and its drain connected to the source of an n-type field-effect transistor M4. Transistor M4 has its source connected to ground and its gate connected to its drain. The current generation circuit 208 generates a reference current that is mirrored by the current sources 201 and 203. A capacitor Cp is connected between the gate and source of transistor M2. The capacitance of capacitor Cp is used for ensuring loop stability. Essentially, the current generation circuit 208 is a voltage to current converter that converts the ngate control voltage to a current.

Current source 201 includes p-type field-effect transistors M5 and M6 whose sources are connected to the voltage source and whose gates are connected to the gate of transistor M2. Transistor M5 has its drain connected to a node A which is connected to a switch SW1 controlled by clock signal clk_fc_0deg_r. The other terminal of switch SW1 is connected at output node outp to an upper terminal of positive output capacitor Coutp whose other terminal is connected to ground. Transistor M6 has its drain connected to a node B which is connected to a switch SW2 controlled by clock signal clk_2xfc_45deg_f. The other terminal of switch SW2 is connected to a switch SW3 controlled by clock signal clk_fc_0deg_f. The other terminal of switch SW3 is connected at output node outn to an upper terminal of negative output capacitor Coutn whose other terminal is connected to ground. The output capacitor 205 of FIG. 2 comprises differential positive output capacitor Coutp and negative output capacitor Coutn. In one embodiment, transistor M5 mirrors and multiplies the reference current by a factor of five and transistor M6 mirrors and multiplies the reference current by a factor of seven.

Node A is also connected between switches SW2 and SW3. Because clk_fc_0deg_r and clk_fc_0deg_f have inverse phase (as illustrated in FIG. 4), the drain of transistor M5 at node A is always connected to charge one of the output capacitors Coutp/Coutn. In contrast, although the drain of transistor M6 at node B is also connectable through switches SW1 and SW3 to charge one of the output capacitors Coutp/Coutn, it does so only when SW2 is closed; otherwise, transistor M6 charges auxiliary capacitor CauxH via switch SW7, as described in more detail below. In this manner, the output capacitor Coutp/Coutn may be charged at a first rate when only transistor M5 is charging it and may be charged at a faster second rate when both transistors M5 and M6 are charging it, which accounts for the different slope in the linear segments of the generated PWL pseudo-sinusoidal waveform of FIG. 4.

Current source 203 includes n-type field-effect transistors M7 and M8 whose sources are connected to ground and whose gates are connected to the gate of transistor M4. Transistor M7 has its drain connected to a node D which is connected to a switch SW4 controlled by clock signal clk_fc_0deg_f. The other terminal of switch SW4 is connected at output node outp to the upper terminal of positive output capacitor Coutp. Transistor M8 has its drain connected to a node E which is connected to a switch SW5 controlled by clock signal clk_2xfc_45deg_f. The other terminal of switch SW5 is connected a switch SW6 controlled by clock signal clk_fc_0deg_r. The other terminal of switch SW6 is connected at output node outn to the upper terminal of negative output capacitor Coutn. In one embodiment, the transistor M7 mirrors and multiplies the reference current by a factor of five and transistor M8 mirrors and multiplies the reference current by a factor of seven.

Node D is also connected between switches SW5 and SW6. Because clk_fc_0deg_r and clk_fc_0deg_f have inverse phase, the drain of transistor M7 at node D is always connected to charge one of the output capacitors Coutp/Coutn. In contrast, although the drain of transistor M8 at node E is also connectable through switches SW4 and SW6 to charge one of the output capacitors Coutp/Coutn, it does so only when SW5 is closed; otherwise, transistor M8 charges auxiliary capacitor CauxL via switch SW9, as described in more detail below. In this manner, the output capacitor Coutp/Coutn may be charged at a first rate when only transistor M7 is charging it and may be charged at a faster second rate when both transistors M7 and M8 are charging it, which accounts for the different slope in the linear segments of the generated PWL pseudo-sinusoidal waveform of FIG. 4.

As shown, the switch network 202 of FIG. 2 comprises the switches controlled by clock signals clk_fc_0deg_f, clk_fc_0deg_r, 2xfc_45deg_f, and 2xfc_45deg_r, whose operation is described in more detail below with respect to FIG. 4. A differential output voltage is thus formed as the difference between the voltage at positive output node outp and the voltage at negative output node outn. Advantageously, the switch network 202 is arranged such that the output is insensitive to current mismatch.

As shown in FIG. 3, the PWL generator 103 includes a high auxiliary capacitor path 206A and a low auxiliary capacitor path 206B. The high auxiliary capacitor path 206A includes a switch SW7 controlled by clock signal clk_2xfc_45deg_r connected between node B and a node C. A high auxiliary capacitor CauxH is connected between node C and ground. A switch SW8 controlled by clock signal clk_2xfc_45deg_f is connected between node C and ground. The low auxiliary capacitor path 206B includes a switch SW9 controlled by clock signal clk_2xfc_45deg_r connected between node E and a node F. A low auxiliary capacitor CauxL is connected between node F and ground. A switch SW10 controlled by clock signal clk_2xfc_45deg_f is connected between node F and a voltage source denoted vdda in FIG. 3. In one embodiment, the constant value of voltage source vdda corresponds to the voltage source of the current source 201 and the current generation circuit 208.

FIG. 4 is an example timing diagram illustrating example control waveforms for switches of switch network 202 of FIG. 3 and illustrating an example PWL pseudo-sinusoidal waveform generated by PWL generator 103 of FIG. 3 in accordance with embodiments of the present disclosure. Control clock signals clk_fc_0deg_f, clk_fc0deg_r. 2xfc_45deg_f, and 2xfc_45deg_r operate as shown to control the switches of switch network 202 to cause the PWL generator 103 to generate PWL pseudo-sinusoidal waveforms at output nodes outp and outn whose phases are inverted relative to one another, as shown. The PWL pseudo-sinusoidal waveform has predetermined voltage values at certain points of time during a cycle with linear changes in the voltage in between the predetermined voltage points. For example, as shown in FIG. 4, the negative output voltage outn is designed to have a voltage of zero at the beginning of the first time segment, a voltage Vz at the beginning of the second time segment, a voltage that is the common mode voltage Vcm half-way through the second time segment, a voltage Vy at the beginning of the third time segment, a peak voltage at the beginning of the fourth time segment, a voltage Vy at the beginning of the fifth time segment, a voltage Vz at the beginning of the sixth time segment, and a voltage of zero at the end of the sixth time segment. The positive output voltage outp is the inverse of negative output voltage outn. The differential output voltage, i.e., outp minus outn, is a PWL pseudo-sinusoidal waveform having the same frequency as outp and outn and with an amplitude twice that of reference voltage vrefp, with a common mode voltage of zero.

During a first time segment, clk_fc_0deg_f is high, clk_fc_0deg_r is low, 2xfc_45deg_f is low, and 2xfc_45deg_r is high, which operates the switch network 202 to cause positive output capacitor Coutp to be drained by transistor M7 from its peak voltage to a voltage Vy, resulting in a first linear piece of the outp waveform having a negative slope. Additionally, the clock values operate the switch network 202 to cause negative output capacitor Coutn to be charged by transistor M5 from zero volts to a voltage Vz resulting in a first linear piece of the outn waveform having a positive slope.

During a second time segment, clk_fc_0deg_f remains high, clk_fc_0deg_r remains low, 2xfc_45deg_f is high, and 2xfc_45deg_r is low, which operates the switch network 202 to cause positive output capacitor Coutp to be drained by transistors M7 and M8 from voltage Vy to voltage Vz, resulting in a second linear piece of the outp waveform having a more negative slope than the first piece. Additionally, the clock values operate the switch network 202 to cause negative output capacitor Coutn to be charged by transistors M5 and M6 from voltage Vz to voltage Vy resulting in a second linear piece of the outn waveform having a more positive slope than the first piece. In one embodiment, the ratio of the slopes of the first and second pieces is the square root of two.

During a third time segment, clk_fc_0deg_f remains high, clk_fc_0deg_r remains low, 2xfc_45deg_f is low, and 2xfc_45deg_r is high, which operates the switch network 202 to cause positive output capacitor Coutp to be drained by transistor M7 from voltage Vz to zero volts, resulting in a third linear piece of the outp waveform having a negative slope of the first piece. Additionally, the clock values operate the switch network 202 to cause negative output capacitor Coutn to be charged by transistor M5 from voltage Vy to its peak voltage resulting in a third linear piece of the outn waveform having a positive slope of the first piece.

During a fourth time segment, clk_fc_0deg_f is low, clk_fc_0deg_r is high, 2xfc_45deg_f remains low, and 2xfc_45deg_r remains high, which operates the switch network 202 to cause positive output capacitor Coutp to be charged by transistor M5 from zero volts to voltage Vz resulting in a fourth linear piece of the outp waveform having a positive slope. Additionally, the clock values operate the switch network 202 to cause negative output capacitor Coutn to be drained by transistor M7 from its peak voltage to a voltage Vy, resulting in a fourth linear piece of the outn waveform having a negative slope.

During a fifth time segment, clk_fc_0deg_f remains low, clk_fc_0deg_r remains high, 2xfc_45deg_f is high, and 2xfc_45deg_r is low, which operates the switch network 202 to cause positive output capacitor Coutp to be charged by transistors M5 and M6 from voltage Vz to voltage Vy resulting in a fifth linear piece of the outp waveform having a more positive slope than the fourth piece. Additionally, the clock values operate the switch network 202 to cause negative output capacitor Coutn to be drained by transistors M7 and M8 from voltage Vy to voltage Vz, resulting in a fifth linear piece of the outn waveform having a more negative slope than the fourth piece.

During a sixth time segment, clk_fc_0deg_f remains low, clk_fc_0deg_r remains high, 2xfc_45deg_f is low, and 2xfc_45deg_r is high, which operates the switch network 202 to cause positive output capacitor Coutp to be charged by transistor M5 from voltage Vy to its peak voltage resulting in a sixth linear piece of the outp waveform having a positive slope of the fourth piece. Additionally, the clock values operate the switch network 202 to cause negative output capacitor Coutn to be drained by transistor M7 from voltage Vz to zero volts, resulting in a sixth linear piece of the outn waveform having a negative slope of the fourth piece.

The pattern repeats periodically to produce a PWL pseudo-sinusoidal waveform whose frequency is the frequency of clk_fc_0deg_f (and clk_fc_0deg_r). The linear pieces of the pseudo-sinusoidal waveform may be understood as the integration of square waves that are the control clock signals that operate to control switches of the switched-capacitor network. As may be observed from FIG. 3 and its operation according to FIG. 4, glitches could occur at the intersections of the linear pieces—in particular the intersections with the steeper sloped pieces—due to the fact that the drains of transistors M6 and M8 would be left floating during the time their respective switches SW2 and SW5 are open (absent the presence and operation of the auxiliary capacitor paths 206A and 206B). However, advantageously, the auxiliary capacitor paths 206A and 206B operate to mitigate glitching, as described in more detail below with respect to FIGS. 9 through 11, and to do so in a more power efficient manner than conventional methods, e.g., that employ a high power voltage buffer. Furthermore, the PWL pseudo-sinusoidal waveform could be imprecise due to temperature, process, frequency and/or loading variation, e.g., failing to accurately hit the desired zero, peak and intermediate voltages Vy and Vz. However, advantageously, the feedback control loop 207 operates to heighten precision of the PWL pseudo-sinusoidal waveform by controlling the current generation based on the PWL generator 103 output, as described in more detail with respect to FIGS. 5 through 8.

Figure 5:
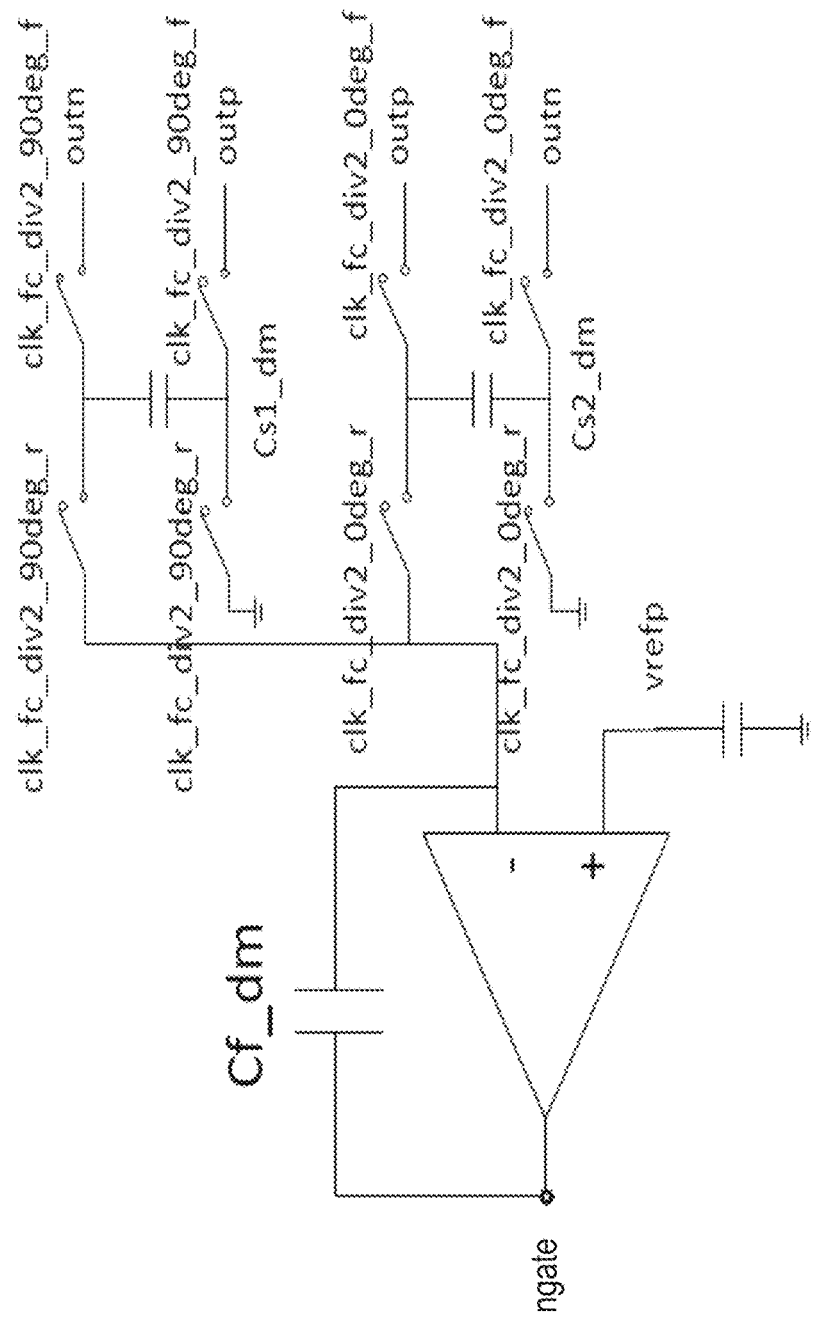
FIG. 5 is an example circuit diagram illustrating a differential mode control loop portion of the feedback control loop of FIG. 2 in accordance with embodiments of the present disclosure.

FIG. 5 is an example circuit diagram illustrating a differential mode control loop portion of the feedback control loop 207 of FIG. 2 in accordance with embodiments of the present disclosure. The differential mode control loop includes an integrator that generates the ngate control signal. The integrator comprises an operational amplifier stage having a feedback capacitor Cf_dm connected between its output and its inverting input. The non-inverting input is connected to a reference voltage vrefp that is capacitively coupled to ground, and the inverting input is connected to a switched-capacitor network that is connected to the output outp and outn. The integrator is used to integrate the error between the reference voltage vrefp and the sampled output differential amplitude between outp and outn.

The switched-capacitor network includes a first switch controlled by a clock signal clk_fc_div2_0deg_r that is connected on one side to ground and on the other side to a lower terminal of a capacitor Cs2_dm. A second switch controlled by a clock signal clk_fc_div2_0deg_f is connected on one side to the lower terminal of capacitor Cs2_dm and on the other side to negative output outn. A third switch controlled by clock signal clk_fc_div2_0deg_r is connected on one side to the inverting input and on the other side to the upper terminal of capacitor Cs2_dm. A fourth switch controlled by clock signal clk_fc_div2_0deg_f is connected on one side to the upper terminal of capacitor Cs2_dm and on the other side to positive output outp. A fifth switch controlled by a clock signal clk_fc_div2_90deg_r is connected on one side to ground and on the other side to a lower terminal of a capacitor Cs1_dm. A sixth switch controlled by a clock signal clk_fc_div2_90deg_f is connected on one side to the lower terminal of capacitor Cs1_dm and on the other side to positive output outp. A seventh switch controlled by clock signal clk_fc_div2_90deg_r is connected on one side to the inverting input and on the other side to the upper terminal of capacitor Cs1_dm. An eighth switch controlled by clock signal clk_fc_div2_90deg_f is connected on one side to the upper terminal of capacitor Cs1_dm and on the other side to negative output outn. Operation of the differential mode control loop portion of the feedback control loop 207 is described with respect to FIG. 6. As may be observed from FIG. 6, the clock signals clk_fc_div2_0deg_f, clk_fc_div2_0deg_r, clk_fc_div2_90deg_f, and clk_fc_div2_90deg_r are correlated to the PWL output waveform and are therefore correlated to the clock signals of FIGS. 3 and 4 that control the switch network 202. As also may be observed, the feedback control loop is sampling the peak of the PWL output waveform in order to control the amplitude of the PWL output waveform.

Figure 6:
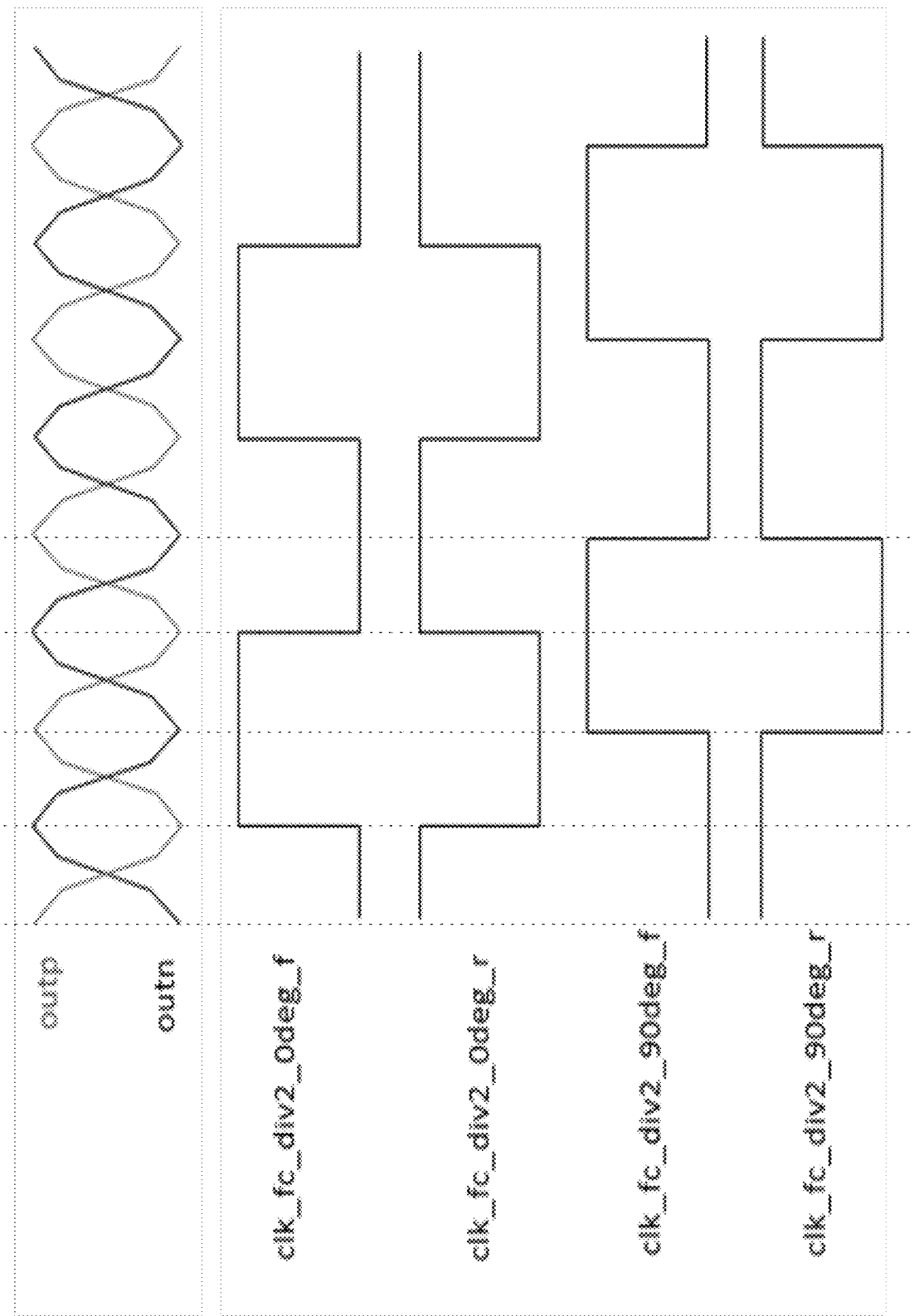
FIG. 6 is an example timing diagram illustrating example control waveforms for switches of the switched-capacitor network of the differential mode control loop portion of FIG. 5 of the feedback control loop of FIG. 2 in accordance with embodiments of the present disclosure.

FIG. 6 is an example timing diagram illustrating example control waveforms for switches of the switched-capacitor network of the differential mode control loop portion of FIG. 5 of the feedback control loop 207 of FIG. 2 in accordance with embodiments of the present disclosure. Control clock signals clk_fc_div2_0deg_f, clk_fc_div2_0deg_r, clk_fc_div2_90deg_f, and clk_fc_div2_90deg_r operate as shown to control the switches of the switched-capacitor network of FIG. 5 to integrate the error between the reference voltage vrefp and the sampled output differential amplitude between outp and outn. The operation of the control clock signals is shown relative to the example PWL pseudo-sinusoidal waveform generated by PWL generator 103 of FIG. 3 shown in FIG. 4 at output nodes outp and outn whose phases are inverted relative to one another. More specifically, during a first time segment (corresponding to the first three linear pieces of the outp waveform having negative slopes and the first three linear pieces of the outn waveform having positive slopes as shown in FIG. 4), clk_fc_div2_0deg_f is low, clk_fc_div2_0deg_r is high, clk_fc_div2_90deg_f is low, and clk_fc_div2_90deg_r is high. During a second time segment (corresponding to the second three linear pieces of the outp waveform having positive slopes and the second three linear pieces of the outn waveform having negative slopes as shown in FIG. 4), clk_fc_div2_0deg_f is high, clk_fc_div2_0deg_r is low, clk_fc_div2_90deg_f is low, and clk_fc_div2_90deg_r is high. During a third time segment (corresponding to the third three linear pieces of the outp waveform having negative slopes and the third three linear pieces of the outn waveform having positive slopes as shown in FIG. 4), clk_fc_div2_0deg_f is high, clk_fc_div2_0deg_r is low, clk_fc_div2_90deg_f is high, and clk_fc_div2_90deg_r is low. During a fourth time segment (corresponding to the fourth three linear pieces of the outp waveform having positive slopes and the fourth three linear pieces of the outn waveform having negative slopes as shown in FIG. 4), clk_fc_div2_0deg_f is low, clk_fc_div2_0deg_r is high, clk_fc_div2_90deg_f is high, and clk_fc_div2_90deg_r is low. The pattern repeats periodically to control the switches of the switched-capacitor network of FIG. 5 operate according to the control signals of FIG. 6 to control the integrator of FIG. 5 to integrate the error between the reference voltage vrefp and the sampled output differential amplitude between outp and outn. More specifically, according to FIGS. 5 and 6, the output outp-outn is sampled on the top plate of capacitor Cs1_dm at the end of the fourth time segment, and the output outn-outp is sampled on the top plate of capacitor Cs2_dm at the end of the third time segment. The integrator integrates the error between the reference voltage vrefp and the sampled output differential amplitude and generates the ngate control voltage. The ngate control voltage then adjusts the current sources in reaction to the integrated error and minimizes the integrated error.

Figure 7:
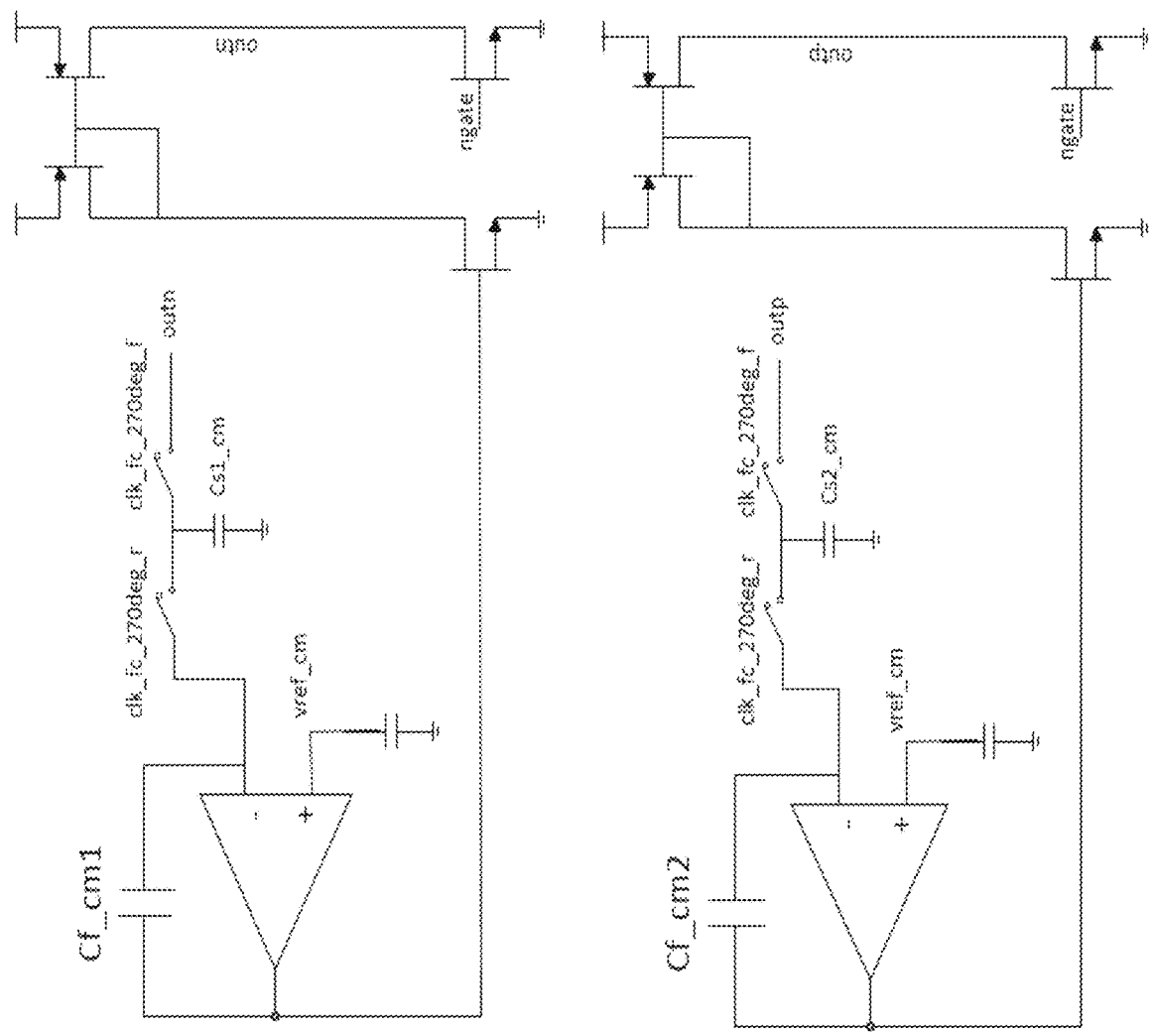
FIG. 7 is an example circuit diagram illustrating a common mode control loop portion of the feedback control loop of FIG. 2 in accordance with embodiments of the present disclosure.

FIG. 7 is example circuit diagrams illustrating a common mode control loop portion of the feedback control loop 207 of FIG. 2 in accordance with embodiments of the present disclosure. FIG. 7 shows both positive and negative side common mode control loops which are very similar and will be described together with their respective elements separated by "/". Each of the common mode control loops includes an integrator that comprises an operational amplifier stage having a feedback capacitor Cf_cm1/Cf_cm2 connected between its output and its inverting input. The non-inverting input is connected to a reference voltage vref_cm that is capacitively coupled to ground, and the inverting input is connected to a switched-capacitor network that is connected to the output outp/outn. The integrator is used to integrate the error between the reference voltage vref_cm and the sampled output common mode.

The switched-capacitor network includes a first switch controlled by a clock signal clk_fc_270deg_r that is connected on one side to the inverting input and on the other side to an upper terminal of a capacitor Cs1_cm/Cs2_cm. A second switch controlled by a clock signal clk_fc_270deg_f is connected on one side to the upper terminal of capacitor Cs1_cm/Cs2_cm and on the other side to negative/positive output outn/outp. The lower terminal of the capacitor Cs1_cm/Cs2_cm is connected to ground. The output of the integrator controls a current source that generates a common mode current driven to output node outn/outp to charge/drain the output capacitors Coutn/Coutp. More specifically, the output of the integrator is connected to the gate of a first n-type field-effect transistor whose source is connected to ground and whose drain is connected to the drain of a first p-type field-effect transistor whose source is connected to a voltage source and whose gate is connected to its drain. A second n-type field-effect transistor has its gate connected to receive feedback control signal ngate described with respect to FIG. 5, its source connected to ground, and its drain connected to output node outn/outp. A second p-type field-effect transistor has its gate connected to the gate of the first p-type field-effect transistor, its source connected to the voltage source, and its drain connected to output node outn/outp. Operation of the common mode control loop portion of the feedback control loop 207 is described with respect to FIG. 8.

Figure 8:
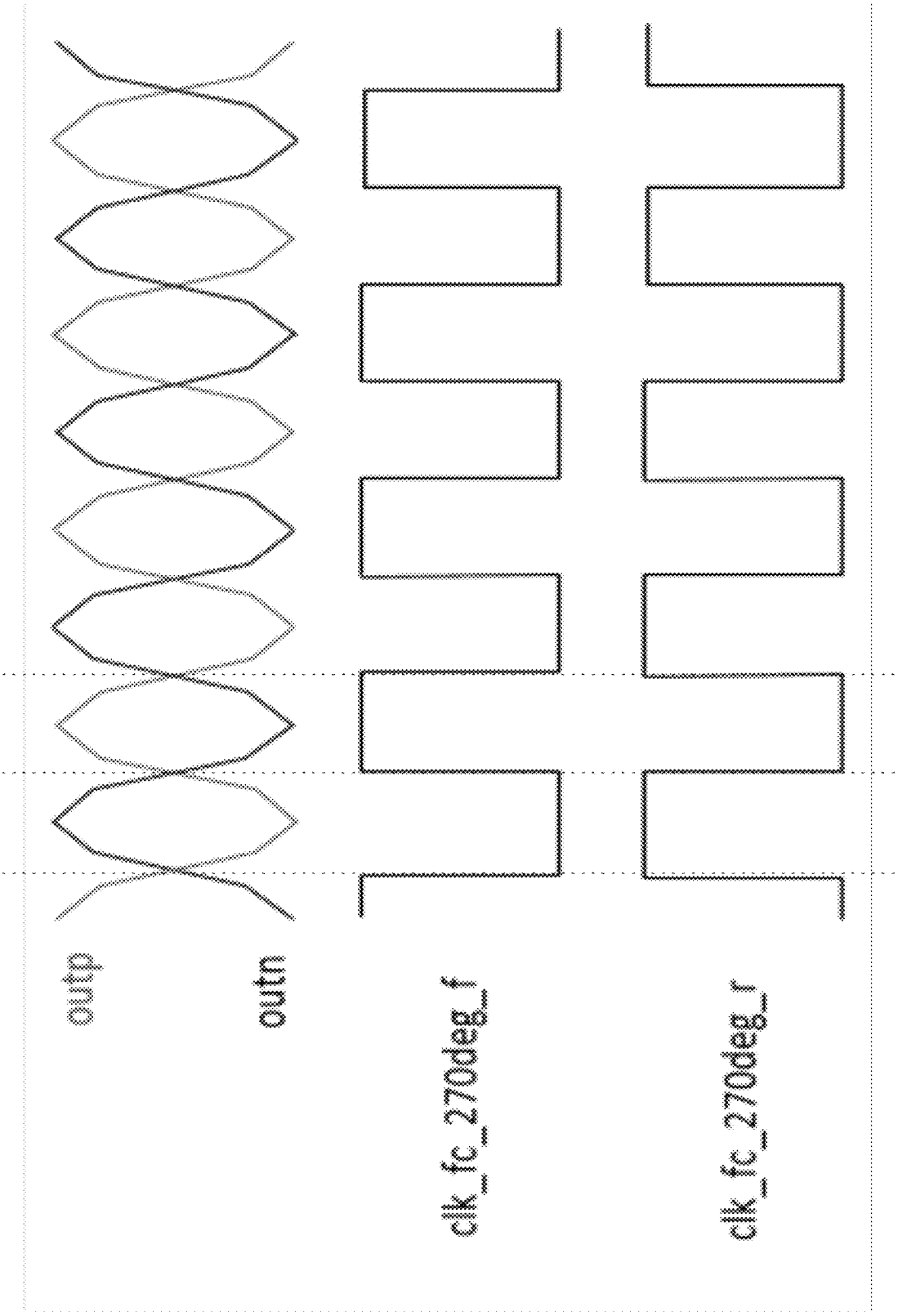
FIG. 8 is an example timing diagram illustrating example control waveforms for switches of the switched-capacitor network of the common mode control loop portion of FIG. 7 of the feedback control loop of FIG. 2 in accordance with embodiments of the present disclosure.

FIG. 8 is an example timing diagram illustrating example control waveforms for switches of the switched-capacitor network of the common mode control loop portion of FIG. 7 of the feedback control loop 207 of FIG. 2 in accordance with embodiments of the present disclosure. Control clock signals clk_fc_270deg_f and clk_fc_270deg_r operate as shown to control the switches of the switched-capacitor network of FIG. 7 to integrate the error between the common mode reference voltage vref_cm and the sampled output common mode. The operation of the control clock signals is shown relative to the example PWL pseudo-sinusoidal waveform generated by PWL generator 103 of FIG. 3 shown in FIG. 4 at output nodes outp and outn whose phases are inverted relative to one another. More specifically, during a first time segment (corresponding to the four linear pieces of the outp waveform below the common mode, i.e., in the lower half of the pseudo-sinusoidal waveform, and to the four linear pieces of the outn waveform above the common mode, i.e., in the upper half of the pseudo-sinusoidal waveform as shown in FIG. 4), clk_fc_270deg_f is low and clk_fc_270deg_r is high. During a second time segment (corresponding to the four linear pieces of the outp waveform above the common mode, i.e., in the upper half of the pseudo-sinusoidal waveform, and to the four linear pieces of the outn waveform below the common mode, i.e., in the lower half of the pseudo-sinusoidal waveform, as shown in FIG. 4), clk_fc_270deg_f is high and clk_fc_270deg_r is low. The pattern repeats periodically to control the switches of the switched-capacitor network of FIG. 7 to operate according to the control signals of FIG. 8 to control the integrator of FIG. 7 to integrate the error between the common mode reference voltage vref_cm and the sampled output common mode. More specifically, the output outn/outp common mode voltage is sampled on the top plate of capacitor Cs1_cm/Cs2_cm at the end of the second time segment. The integrator integrates the error between vref_cm and the sampled output outp/outn common mode voltage and generates the gate voltage to control the gate of the current source and then changes the current going to the output capacitors. The current going to the output capacitors reacts to the integrated error such that the integrated error is minimized. As may be observed from FIG. 8, the clock signals clk_fc_270deg_f and clk_fc_270deg_r are correlated to the PWL output waveform and are therefore correlated to the clock signals of FIGS. 3 and 4 that control the switch network 202. As also may be observed, the feedback control loop is sampling the peak of the PWL output waveform in order to control the common mode voltage of the PWL output waveform.

As may be observed from the description above, a low bandwidth switched-capacitor feedback loop 207 controls, or regulates, the output differential amplitude and common mode voltage, which advantageously enables the PWL generator 103 to consume low power and makes the circuit insensitive to capacitive loading, temperature, process and frequency variations which means the circuit advantageously may not need calibration. Additionally, generation of PWL waveforms by the embodiments described herein may have the advantage of reduced power consumption and may have the advantage of not consuming additional pins on an integrated circuit that includes the system 100.

Although embodiments are described in the context of an inductive sensing application, the PWL generator 103 and aspects that enable its low power and high precision characteristics may be applicable to other applications, e.g., a ramp generator used by a quantizer of a Class-D amplifier, DC-DC converter control loop, etc. For example, a conventional ramp generator may employ a trimmable resistor that may be used to generate a current to an operational amplifier. The resistor may be subject to process and temperature variation. Therefore, the trimmable resistor may need to be calibrated for variation in process and/or temperature. Variations of embodiments of the PWL generator described herein may be employed in a ramp generator to advantageously alleviate the need for calibration since the embodiments do not require a trimmable resistor and are robust with respect to process and temperature variation. For another example, a ramp signal generator such as described in U.S. Pat. No. 10,715,121 may suffer from current mirror mismatch in the reference-current generation subcircuit that may affect the amplitude of the output signal. More specifically, the control loop of U.S. Pat. No. 10,715,121 samples an internal value rather than the output of the circuit; whereas, embodiments of the feedback control loop 207 described herein advantageously sample the output of the PWL generator 103 (i.e., outp and outn) which is used by the feedback control loop 207 to control the current generation circuit 208. In some embodiments, the DC-DC converter control loop also includes a ramp generator. Variations of embodiments of the PWL generator described herein may be employed in a ramp generator to advantageously alleviate the need for calibration.

Figure 9:
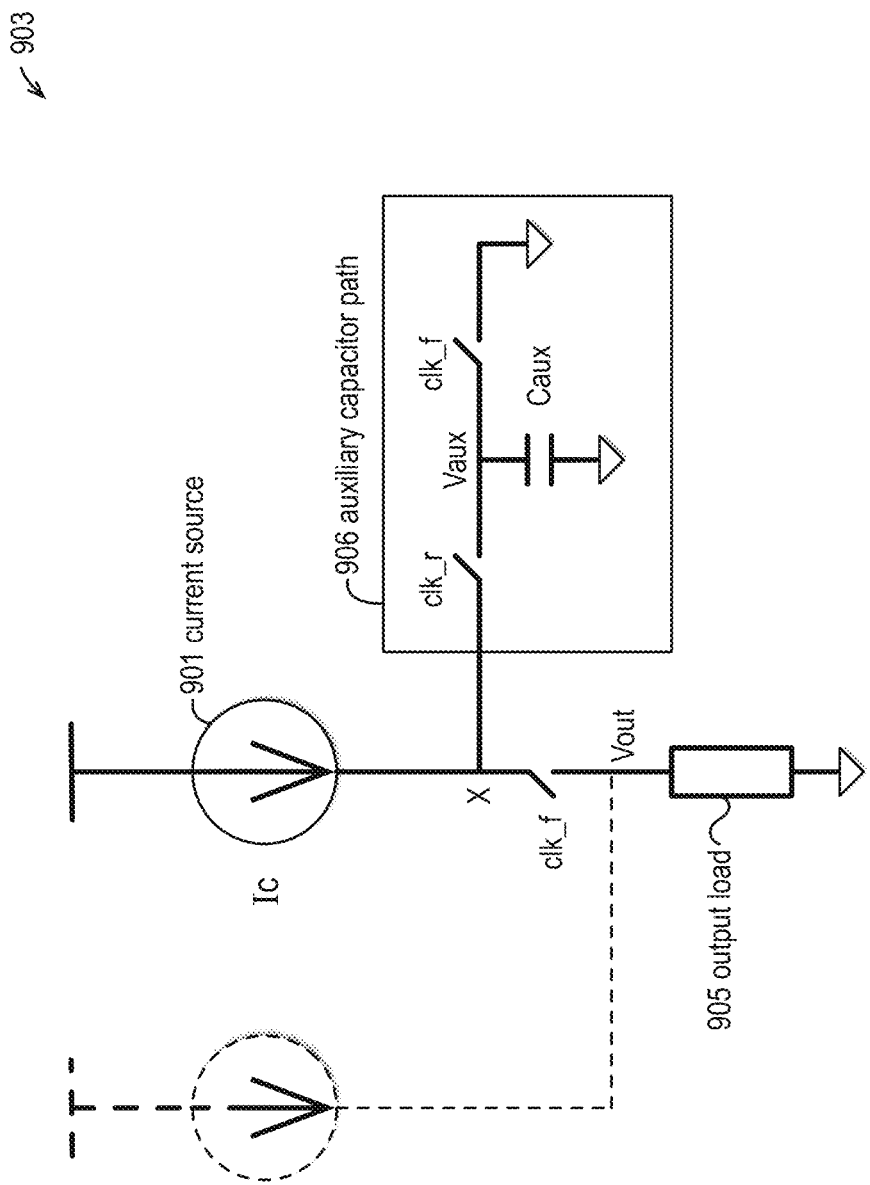
FIG. 9 is an example block diagram of a current steering circuit that employs an auxiliary capacitor path in accordance with embodiments of the present disclosure.

FIG. 9 is an example block diagram of a current steering circuit 903 that employs an auxiliary capacitor path 906 in accordance with embodiments of the present disclosure. A current steering circuit is a circuit that includes multiple current sources that are connected to an output via switches. Each switch may be controlled independently, thus "steering" the current between the output and internal nodes, or between different outputs. The switches may be controlled by a digital signal such that the current connected to the output represent the desired signal. The current steering circuit 903 of FIG. 9 includes a current source 901 (e.g., current source 201 of FIG. 3), an output load 905 (e.g., output capacitor Coutp of FIG. 3) connected at its lower terminal to ground, and an auxiliary capacitor Caux (e.g., auxiliary capacitor CauxH of FIG. 3). Although the embodiment of FIG. 9 may be described in some respects with respect to a differential embodiment such as with respect to FIG. 3, an auxiliary capacitor path 906 such as that of FIG. 9 may be employed in non-differential embodiments.

An upper terminal of a first switch controlled by clock signal clk_f (e.g., clk_2xfc_45deg_f of FIG. 3) is connected to the drain of current source 901 at a node X (e.g., node B of FIG. 3) and is connected to the upper terminal of output load 905. The output voltage across output load 905 is Vout (e.g., outp/outn of FIG. 3). A lower terminal of auxiliary capacitor Caux is connected to ground. The voltage across auxiliary capacitor Caux is shown as voltage Vaux (e.g., node C of FIG. 3). The value of Caux is chosen in order to cause voltage Vaux to reach a predetermined voltage (e.g., voltage Vy or Vz of FIG. 4) in order to mitigate glitching, as described in more detail below with respect to FIG. 10. A second switch controlled by a clock signal clk_r (e.g., clk_2xfc_45deg_r of FIG. 3) is connected between the upper terminal of auxiliary capacitor Caux and node X. A third switch controlled by the clock signal clk_f is connected between the upper terminal of capacitor Caux and a voltage source, e.g., to ground as shown in FIG. 9, or alternatively to another voltage source, e.g., vdda of FIG. 3. In an alternate embodiment, the third switch may be connected to an additional current source (not shown) rather than to a voltage source (e.g., ground or vdda). The phases of clock signals clk_r and clk_f are inverted. In the example embodiment of FIG. 3, the output load 905 (e.g., output capacitor Coutp) may also be connected to a second current source (e.g., transistor M5 of FIG. 3), as shown by the dotted portion of the circuit of FIG. 9.

In other words, the current source device 901 of the current steering circuit of FIG. 9 is periodically connected and disconnected to the output load 905 via the first switch clk_f. The drain of the current source device 901 needs to be held at a predetermined voltage when the current source 901 is disconnected from the output load 905. Conventional solutions employ a high bandwidth buffer to generate this voltage. Ignoring parasitic capacitance, the value of Caux is chosen to be equal to Caux=Ic*t_clk_r/Vz, wherein Ic is the known current provided by current source. t_clk_r is the time the current source drain is shorted to the auxiliary capacitor, and Vz is the output voltage right before the switch connects the current source to the output. By setting the capacitance of Caux to the needed value, when the current source is connected to the output, the voltage of the auxiliary capacitor is at the predetermined voltage Vz. Advantageously, the auxiliary capacitor path 906 may enable glitch avoidance in the context of a current steering circuit. Operation of an embodiment of an auxiliary capacitor path 906 according to use in the example embodiment of FIG. 3 will now be described with respect to FIGS. 10 and 11.

Figure 10:
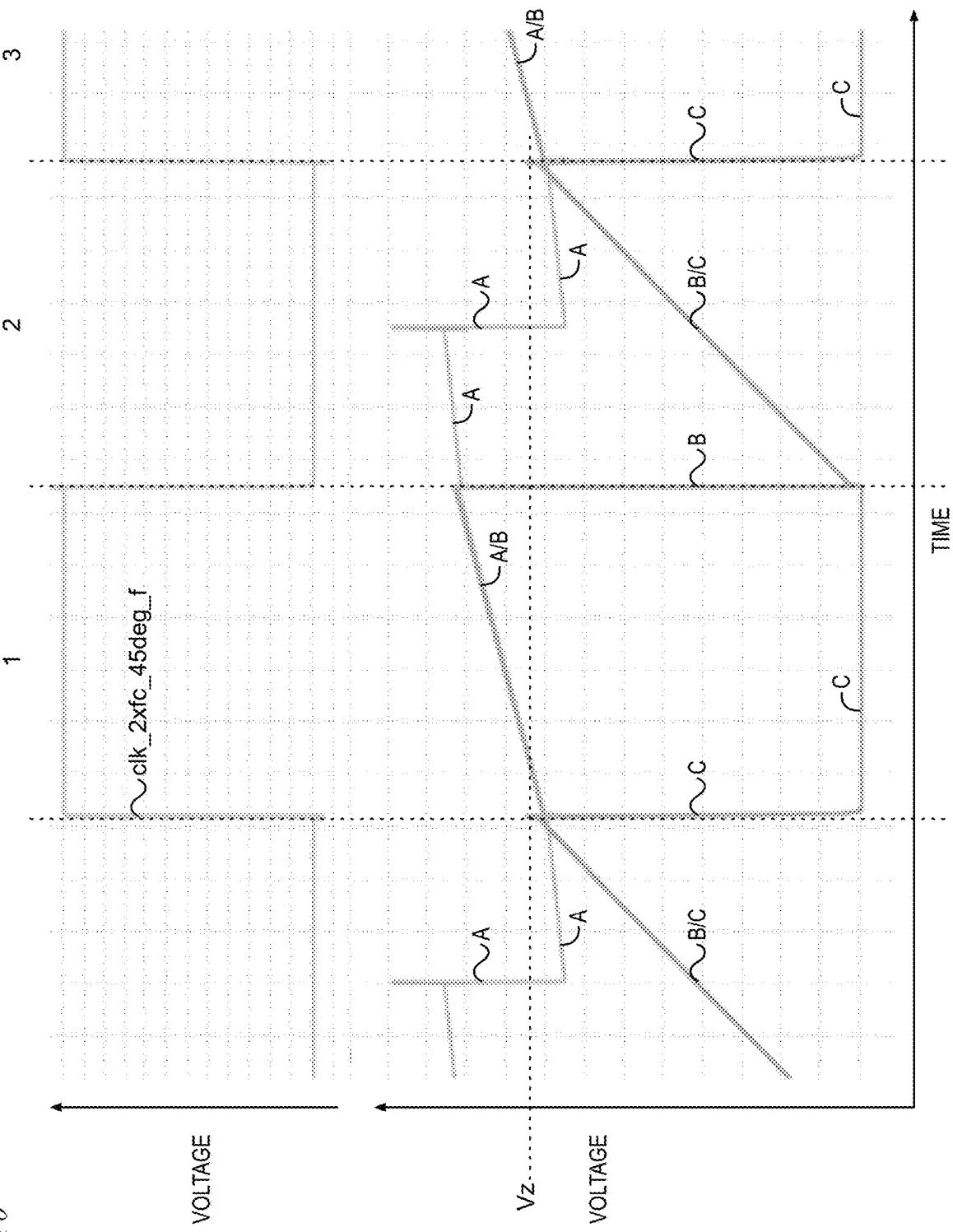
FIGS. 10 and 11 are example graphs illustrating operation of an auxiliary capacitor path with respect to the PWL generator of FIG. 3 in accordance with embodiments of the present disclosure.

FIG. 10 is an example graph illustrating operation of an auxiliary capacitor path with respect to the PWL generator 103 of FIG. 3 in accordance with embodiments of the present disclosure. FIG. 10 illustrates operation of the high side auxiliary capacitor path 206A of FIG. 3 (i.e., that includes the auxiliary capacitor CauxH and node C). In FIG. 10, the voltages of clock signal clk_2xfc_45deg_f and nodes A, B and C of FIG. 3 are shown.

During a first time segment, clock signal clk_2xfc_45deg_f is high, as shown, which opens switch SW7 to disconnect the auxiliary capacitor CauxH from the output of the second current source comprising transistor M6 and closes switch SW8 to connect auxiliary capacitor CauxH to ground. As a result of the closing of switch SW8, auxiliary capacitor CauxH discharges and the voltage at node C drops from voltage Vz to zero, as shown.

At the beginning of a second time segment, clock signal clk_2xfc_45deg_f goes low and clock signal clk_2xfc_45deg_r (not shown) goes high which closes switch SW7 to connect the second current source to auxiliary capacitor CauxH (which connects node B to node C) and opens switch SW8 to disconnect the auxiliary capacitor CauxH from ground. As a result, the second current source charges auxiliary capacitor CauxH, and hence nodes B (i.e., node X of FIG. 9) and C, up to voltage Vz, as shown.

The voltage Vz is a predetermined voltage that is desired at the output of the second current source when switch SW2 connects the output of the second current source to the load impedance, i.e., to output capacitor Coutp/Coutn, which occurs at the rising edge of clock signal clk_2xfc_45deg_f, i.e., at the beginning of the third time segment of FIG. 10. The predetermined voltage Vz is desired because at the beginning of the third time segment, node B gets connected to the output capacitor, and Vz is the voltage to which the output capacitor Coutp/Coutn has risen at the end of the second time segment because it has been charged by transistor M5 of the first current source 201, e.g., during the fourth/first time segment of FIG. 4. That is, the charging of auxiliary capacitor CauxH by transistor M6 of the first current source 201 while the output capacitor is being charged by transistor M5 of the first current source 201 causes node B and the output node outp/outn to be at the same voltage when the drain of transistor M6 is connected to the output capacitor via the closing of SW2 (either switch SW1 or SW3 is also closed at this time).

As a result, the capacitance of CauxH is chosen according to equation (1)

$$CauxH = (Ic * t\_clk\_r)/Vz \qquad (1)$$

where Ic is the predetermined current provided by the second current source, t_clk_r is the time SW7 is closed (i.e., the time the current source drain is connected to the auxiliary capacitor CauxH), and Vz is the predetermined voltage described above, which is one of the predetermined voltage values at which linear changes in the output voltage occur according to the design of the PWL generator 103, as described above. In this manner, glitches are mitigated by the presence of the auxiliary capacitor path when switch SW2 transitions from an open to a closed state. The amount of glitch in the absence of the auxiliary capacitor path would be determined by parasitic capacitance of the current source and a voltage difference between the output and the drain of the current source when it is not connected to the output. Advantageously, by employing a capacitor in the auxiliary capacitor path rather than a conventional high bandwidth voltage buffer, a reduction in power consumption may be enjoyed. A further benefit of the auxiliary capacitor path is that the second current source is kept within its operating range rather than its output being allowed to float up from its operating range when SW2 is open.

Figure 11:
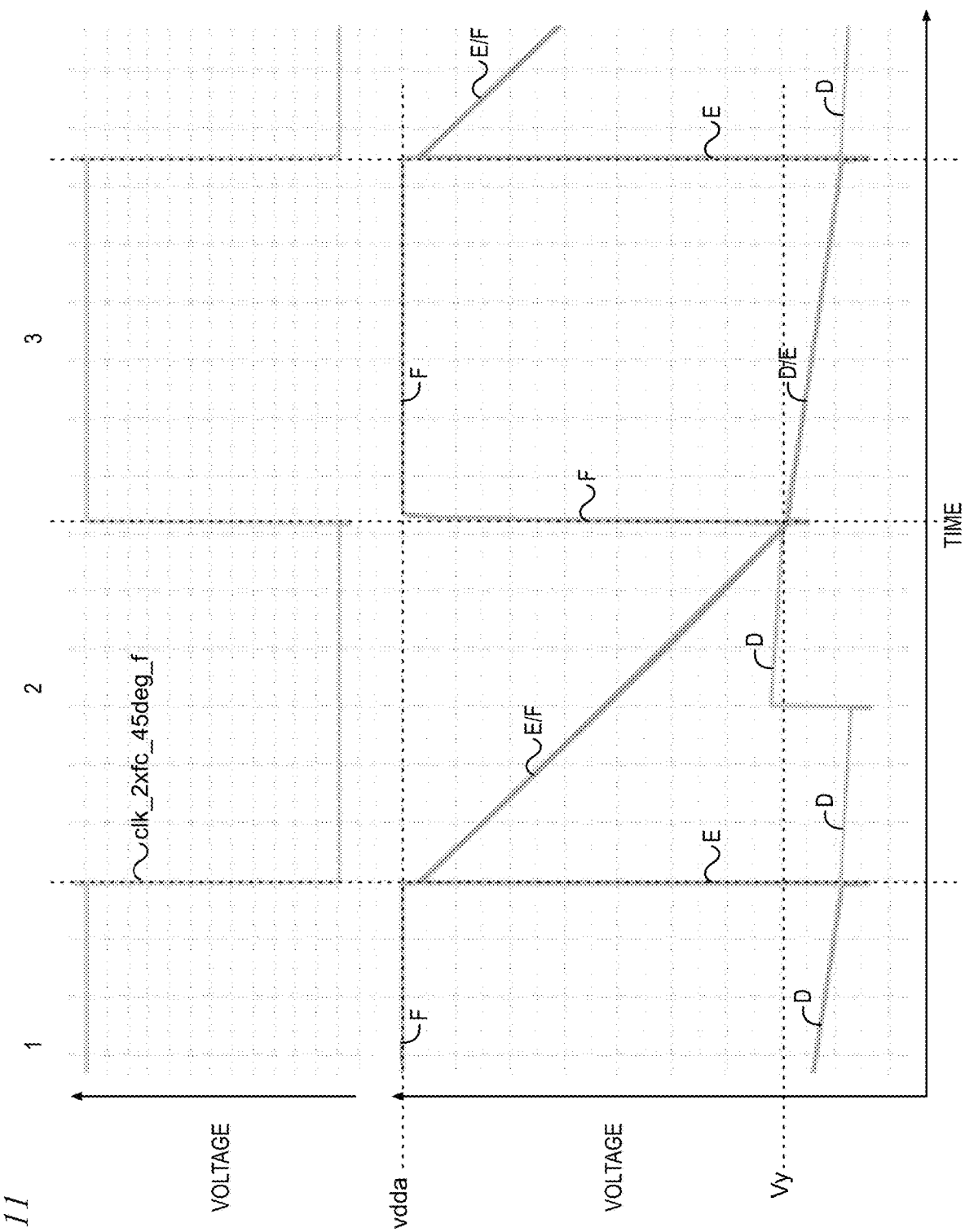

FIG. 11 is an example graph illustrating operation of an auxiliary capacitor path with respect to the PWL generator 103 of FIG. 3 in accordance with embodiments of the present disclosure. FIG. 11 illustrates operation of the low side auxiliary capacitor path 206B of FIG. 3 (i.e., that includes the auxiliary capacitor CauxL and node F). In FIG. 11, the voltages of clock signal clk_2xfc_45deg_f and nodes D, E and F of FIG. 3 are shown. FIG. 11 is similar in some respects to FIG. 10.

During a first time segment, clock signal clk_2xfc_45deg_f is high, as shown, which opens switch SW9 to disconnect the auxiliary capacitor CauxL from the output of the second current source comprising transistor M8 and closes switch SW10 to connect auxiliary capacitor CauxL to voltage source vdda. As a result of the closing of switch SW10, auxiliary capacitor CauxL charges and the voltage at node F rises to voltage vdda, as shown.

At the beginning of a second time segment, clock signal clk_2xfc_45deg_f goes low and clock signal clk_2xfc_45deg_r (not shown) goes high which closes switch SW9 to connect the second current source to auxiliary capacitor CauxL (which connects node E to node F) and opens switch SW10 to disconnect the auxiliary capacitor CauxL from voltage source vdda. As a result, the second current source discharges auxiliary capacitor CauxL, and hence nodes E and F, down to voltage Vy, as shown.

The voltage Vy is a predetermined voltage that is desired at the output of the second current source when switch SW5 connects the output of the second current source to the load impedance, i.e., to output capacitor Coutp/Coutn, which occurs at the rising edge of clock signal clk_2xfc_45deg_f, i.e., at the beginning of the third time segment of FIG. 11. The predetermined voltage Vy is desired because at the beginning of the third time segment node E gets connected to the output capacitor, and Vy is the voltage to which the output capacitor Coutp/Coutn has dropped at the end of the second time segment because it has been discharged by transistor M7 of the second current source 203, e.g., during the fourth/first time segment of FIG. 4. That is, the discharging of auxiliary capacitor CauxL by transistor M8 of the second current source 203 while the output capacitor is being discharged by transistor M7 of the second current source 203 causes node E and the output node outp/outn to be at the same voltage when the drain of transistor M8 is connected to the output capacitor via the closing of SW5 (either switch SW4 or SW6 is also closed at this time).

As a result, the capacitance of CauxL is chosen according to equation (2)

$$CauxL = (Ic * t\_clk\_r)/(vdda - Vy) \qquad (2)$$

where Ic is the predetermined current provided by the second current source, t_clk_r is the time SW9 is closed (i.e., the time the current source drain is connected to the auxiliary capacitor CauxL), vdda is the voltage source, and Vy is the predetermined voltage described above, which is one of the predetermined voltage values at which linear changes in the output voltage occur according to the design of the PWL generator 103, as described above. In this manner, glitches are mitigated by the presence of the auxiliary capacitor path when switch SW5 transitions from an open to a closed state, similar to the manner described above with respect to FIG. 10.

Figure 12:
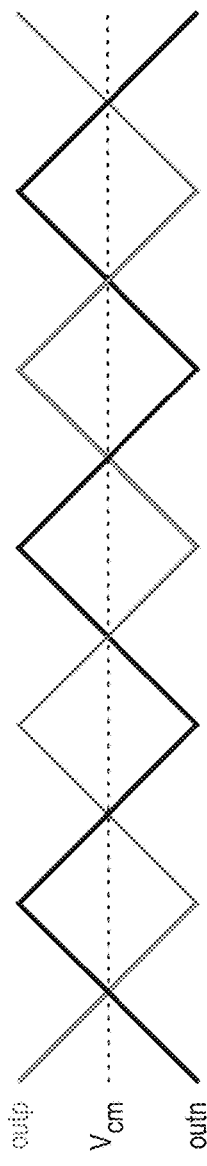
FIG. 12 is an example PWL triangular waveform in accordance with embodiments of the present disclosure.

Although embodiments of a PWL generator having a switched-capacitor network that controls current sources and having a feedback control loop that controls current generation based on an output of the PWL generator have been described that generate a PWL pseudo-sinusoidal waveform, other embodiment are contemplated in which the PWL output waveform is of other types of waveforms, such as sawtooth, triangular, trapezoidal or other waveform. Generally, the current sources 201 and 203 may comprise a plurality of current sources (e.g., a plurality of transistors such as transistors M5 and M6 of current source 201 or transistors M7 and M8 of current source 203) that provide a plurality of currents that may be selectively connected to the differential outputs in a controlled manner by a switch network (e.g., a variant of switch network 202) to charge and discharge the output capacitors to generate the various pieces of a waveform with the desired slopes. For example, to generate a differential PWL triangular waveform, such as shown in FIG. 12, the switch network 202 of the PWL generator 103 embodiment of FIG. 3 may be operated similar to the manner described above, except switches SW2 and SW5 are always left open, i.e., only the currents generated by transistors M5 and M7 are used to generate the PWL triangular waveform, and the currents generated by transistors M6 and M8 are not needed to generate the PWL triangular waveform. In such an embodiment, the auxiliary capacitor paths 206A and 206B may instead be connected to the drains of transistors M5 and M7 rather than to the drains of transistors M6 and M8. For another example, to generate a sawtooth waveform, two additional switches may be added to the embodiment of FIG. 3 at output nodes outp and outn, respectively, which are referred to here as switches SW11 and SW12 (e.g., NMOS switches). More specifically, the drain of switch SW11 may be connected to output node outp, and the drain of switch SW12 may be connected to output node outn, and the sources of each of SW11 and SW12 may be tied to ground. The gate of switch SW11 may be controlled by clock signal clk_fc_0deg_f, and the gate of switch SW12 may be controlled by clock signal clk_fc_0deg_r. Switch SW1 may still be controlled by clock signal clk_fc_0deg_r; however, switch SW6 may be controlled by clock signal clk_fc_0deg_f instead of by clock signal clk_fc_0deg_r. Finally, switches SW2, SW3, SW4, SW5, SW7, SW8, SW9 and SW10 may be left open. These other embodiments may also benefit from the increased precision and the robustness and immunity to variations in loading, temperature, process and frequency afforded by current sources controlled by the switched-capacitor network and output-based feedback control loop.

Furthermore, although embodiments of the auxiliary capacitor path 906 have been described for use in the PWL generator 103 of FIG. 1, other embodiments are contemplated in which the auxiliary capacitor path 906 may be employed in other current steering circuit architectures to selectively connect a current source to an output load or to an internal voltage at different times. Conventionally, the internal voltage is generated by a high power-consuming buffer. However, advantageously, embodiments described employ an auxiliary capacitor path to supply the internal voltage to the current source which may result in lower power consumption than using a high power-consuming buffer. For example, the auxiliary capacitor path may be used in a current digital-to-analog converter (IDAC) or other current steering circuits. For example, to use the auxiliary capacitor path in an IDAC, the predetermined voltage may be the common mode voltage. The switches may be controlled by a digital signal representing the digital input signal to the IDAC. Thus, the resulting output current may become an analog representation of the same digital input signal.

Figure 13:
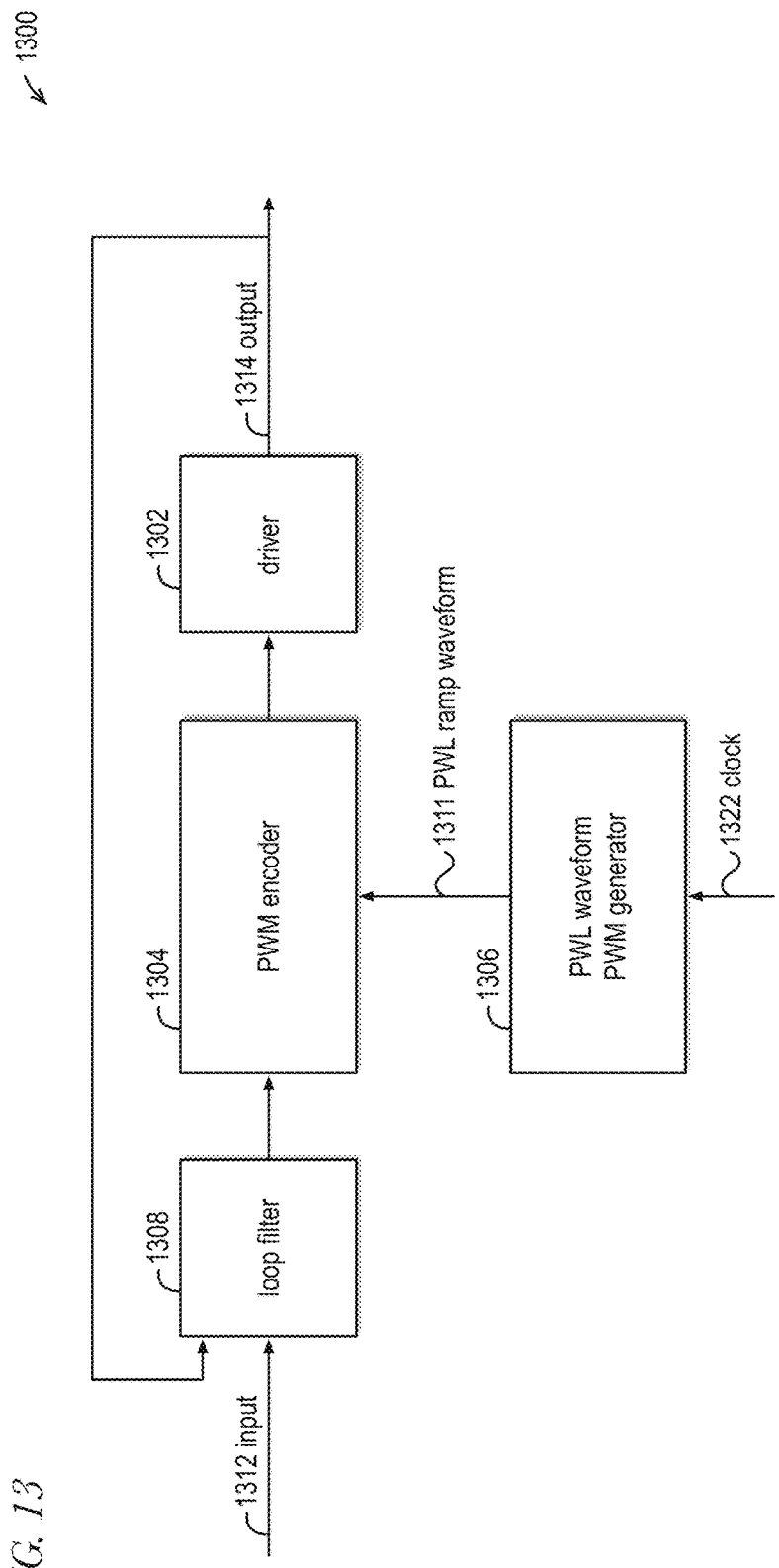
FIG. 13 is an example block diagram of a class D amplifier system that includes a PWL waveform pulse-width modulation (PWM) generator in accordance with embodiments of the present disclosure.

FIG. 13 is an example block diagram of a class D amplifier system 1300 that includes a PWL waveform PWM generator 1306 in accordance with embodiments of the present disclosure. The system 1300 includes a loop filter 1308, a PWM encoder 1304, the PWL waveform PWM generator 1306, and a driver 1302. The driver 1302 receives an output of the PWM encoder 1304 to generate an output 1314 to drive a speaker, for example. The output 1314 of the driver 1302 is fed back into the loop filter 1308. The loop filter 1308 receives an input 1312 that it filters to provide to the PWM encoder 1304. The PWM encoder 1304 additionally receives a PWL ramp waveform 1311 generated by the PWL waveform PWM generator 1306 based on a clock signal 1322. The PWM encoder 1304 may include a quantizer that quantizes the input signal from the loop filter 1308 using the PWL ramp waveform 1311 generated by the PWL waveform PWM generator 1306. The PWM encoder 1304 may encode the quantizer output to generate a PWM signal provided to the driver 1302. Advantageously, the PWL waveform PWM generator 1306 may be configured and operate similarly to embodiments described above with respect to FIGS. 3 through 11 to generate the PWL ramp waveform 1311. In particular, the PWL waveform PWM generator 1306 may employ a feedback control loop similar to those described above and modified to generate a PWL ramp waveform for use by the quantizer.

Figure 14:
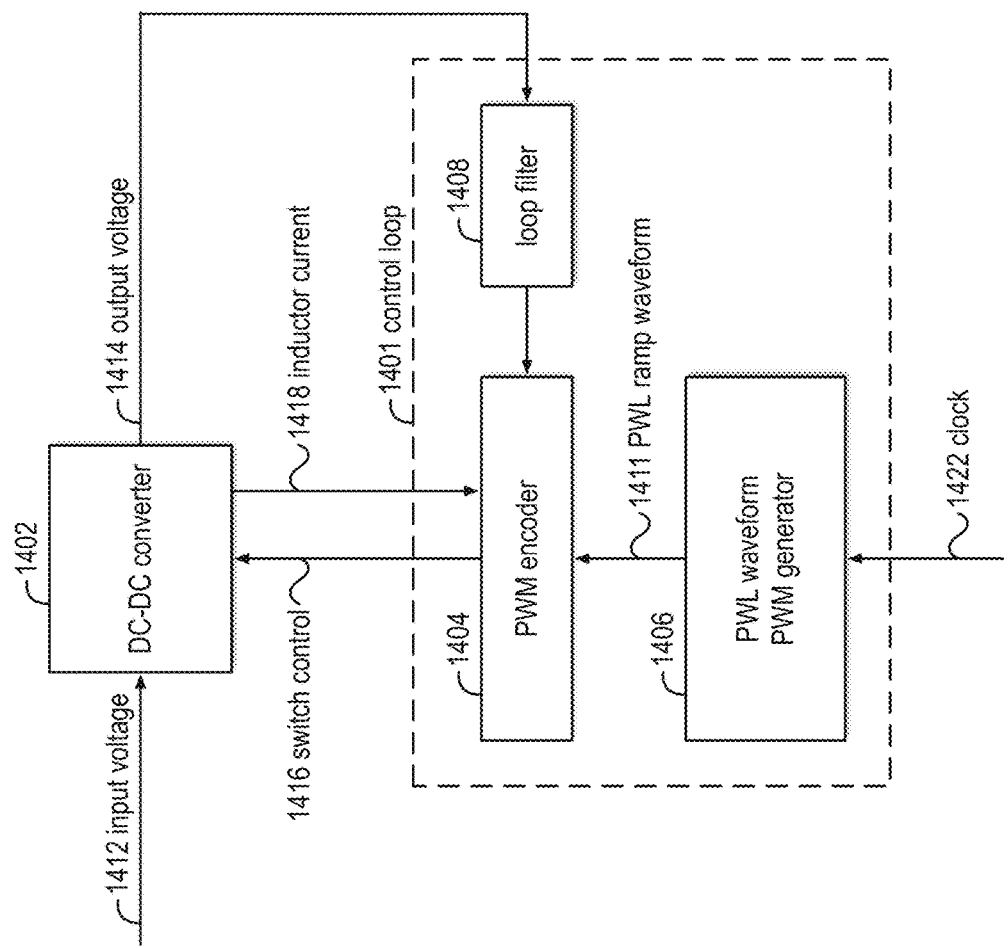
FIG. 14 is an example block diagram of a system that includes a direct current-to-direct current (DC) converter that includes a PWL waveform PWM generator in accordance with embodiments of the present disclosure.

FIG. 14 is an example block diagram of a system 1400 that includes a DC-DC converter 1402 that includes a PWL waveform pulse-width modulation (PWM) generator 1406 in accordance with embodiments of the present disclosure. The DC-DC converter 1402 converts a DC input voltage 1412 to a DC output voltage 1414. The system 1400 includes the DC-DC converter 1402 and a control loop 1401 that receives an inductor current 1418 from the DC-DC converter 1402, along with the DC output voltage 1414, and responsively generates a switch control signal 1416 to the DC-DC converter 1402. The control loop 1401 includes a loop filter 1408, a PWM encoder 1404 and the PWL waveform PWM generator 1406. The loop filter 1408 receives the output voltage 1414 and filters it for provision to the PWM encoder 1404. The PWM encoder 1404 additionally receives the inductor current 1418 and a PWL ramp waveform 1411 generated by the PWL waveform PWM generator 1406 based on a clock signal 1422. The PWM encoder 1404 may include a quantizer that quantizes the input signal from the loop filter 1408 using the PWL ramp waveform 1411 generated by the PWL waveform PWM generator 1406. The PWM encoder 1404 may encode the quantizer output to generate a PWM signal that is the switch control 1416 to the DC-DC converter 1402. Advantageously, the PWL waveform PWM generator 1406 may be configured and operate similarly to embodiments described above with respect to FIGS. 3 through 11 to generate the PWL ramp waveform 1411. In particular, the PWL waveform PWM generator 1406 may employ a feedback control loop similar to those described above and modified to generate a PWL ramp waveform for use by the quantizer.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. A piece-wise linear (PWL) waveform generator, comprising:
    a current generator that generates a reference current;
    an output capacitor across which an output voltage is developed to form a piece-wise linear (PWL) waveform;
    charging and discharging current sources for charging/discharging the output capacitor based on the reference current;
    a clock-controlled switch network connected to the current sources and to the output capacitor for controlling the charging/discharging of the output capacitor; and
    a feedback control loop that senses the output voltage and controls the current generator to vary the reference current based on the output voltage;
    wherein the feedback control loop comprises differential and common mode feedback paths to regulate a differential output voltage and a common mode output voltage.

2. The PWL waveform generator of claim 1, wherein the feedback control loop is a switched-capacitor feedback control loop.

3. The PWL waveform generator of claim 2, wherein clock signals that control the switched-capacitor feedback control loop are correlated with clock signals that control the clock-controlled switch network to sense the output voltage and control the current generator to vary the reference current based on the output voltage to generate the PWL waveform in a manner that is substantially insensitive to at least one of:
    a variation in temperature;
    a variation in process;
    a variation in clock frequency of the switch network;
    a variation in a supply voltage to the PWL waveform generator; and
    a variation in loading on the output of the PWL waveform generator.

4. The PWL waveform generator of claim 1, wherein the PWL waveform generator is employed to generate the PWL waveform in a direct current-to-direct current converter.

5. The PWL waveform generator of claim 1, wherein the PWL waveform generator is employed to generate the PWL waveform in a Class D amplifier.

6. The PWL waveform generator of claim 1, wherein the PWL waveform generator is employed to generate the PWL waveform in a human interface inductive-resistive-capacitive detection system.

7. The PWL waveform generator of claim 1, further comprising:
for each of the current sources, an auxiliary capacitor path connected to the current source; and
wherein the auxiliary capacitor path comprises an auxiliary capacitor that is charged/discharged by the current source while the current source is disconnected from the output capacitor.

8. The PWL waveform generator of claim 7,
wherein the auxiliary capacitor has a capacitance predetermined to cause the auxiliary capacitor to be charged to a predetermined voltage while the current source is disconnected from the output capacitor; and
wherein the predetermined voltage approximates a voltage of the output voltage when the output capacitor is reconnected to the current source.

9. The PWL waveform generator of claim 1, wherein the PWL waveform is a pseudo-sinusoidal waveform.

10. The PWL waveform generator of claim 1, wherein the PWL waveform is a triangular waveform.

11. The PWL waveform generator of claim 1, wherein the PWL waveform is a sawtooth waveform.

12. The PWL waveform generator of claim 1, wherein the feedback control loop of the common mode voltage of the differential output voltage is a switched-capacitor feedback control loop.

13. A method for generating a piece-wise linear (PWL) waveform, comprising:
generating a reference current;
charging and discharging an output capacitor, based on the reference current, to develop an output voltage to form a piece-wise linear (PWL) waveform;
using a clock-controlled switch network connected to the current sources and to the output capacitor to control the charging/discharging of the output capacitor; and
using a feedback control loop to sense the output voltage and to control the current generator to vary the reference current based on the output voltage,
wherein the feedback control loop comprises differential and common mode feedback paths to regulate a differential output voltage and a common mode output voltage.

14. The method of claim 13, wherein the feedback control loop is a switched-capacitor feedback control loop.

15. The method of claim 14, wherein clock signals that control the switched-capacitor feedback control loop are correlated with clock signals that control the clock-controlled switch network to sense the output voltage and control the current generator to vary the reference current based on the output voltage to generate the PWL waveform in a manner that is substantially insensitive to at least one of:
a variation in temperature;
a variation in process;
a variation in clock frequency of the switch network;
a variation in a supply voltage to the PWL waveform generator; and
a variation in loading on the output of the PWL waveform generator.

16. The method of claim 13, wherein the method is employed to generate the PWL waveform in a direct current-to-direct current converter.

17. The method of claim 13, wherein the method is employed to generate the PWL waveform in a Class D amplifier.

18. The method of claim 13, wherein the method is employed to generate the PWL waveform in a human interface inductive-resistive-capacitive detection system.

19. The method of claim 13, wherein the PWL waveform is a pseudo-sinusoidal waveform.

20. The method of claim 13, wherein the PWL waveform is a triangular waveform.

21. The method of claim 13, wherein the PWL waveform is a sawtooth waveform.

22. The method of claim 13, wherein the feedback control loop of the common mode voltage of the differential output voltage is a switched-capacitor feedback control loop.

23. An auxiliary capacitor path for use in a current steering circuit having a current source that drives a load impedance, comprising:
a first switch controlled by a first clock signal to periodically connect and disconnect an output of the current source to and from the load impedance;
a capacitor;
a second switch controlled by a second clock signal to periodically connect and disconnect the capacitor to and from the output of the current source while the current source is respectively disconnected from and connected to the load impedance; and
wherein the capacitor has a capacitance $C=I*T/V$, wherein:
I is a predetermined current generated by the current source;
T is a time during which the second switch connects the capacitor to the output of the current source according to the second clock signal; and
V is a predetermined voltage to which the capacitor is charged by the current source to mitigate glitching of a voltage across the load impedance when the first switch connects the output of the current source to the load impedance according to the first clock signal.

24. The auxiliary capacitor path of claim 23, further comprising:
a third switch controlled by the first clock signal to periodically connect and disconnect the capacitor to and from a predetermined voltage source when the current source is respectively connected to and disconnected from the load impedance.

25. The auxiliary capacitor path of claim 23, wherein the current steering circuit is comprised in a piece-wise linear waveform generator.

26. The auxiliary capacitor path of claim 23, wherein the current steering circuit is comprised in a current steering digital-to-analog converter (DAC).

27. A method for use in a current steering circuit having a current source that drives a load impedance, comprising:
periodically connecting and disconnecting an output of the current source to and from the load impedance using a first switch controlled by a first clock signal;
periodically connecting and disconnecting an auxiliary capacitor to and from the output of the current source, using a second switch controlled by a second clock signal, while the current source is respectively disconnected from and connected to the load impedance; and
wherein the auxiliary capacitor has a capacitance $C=I*T/V$, wherein:
I is a predetermined current generated by the current source;

T is a time during which the second switch connects the auxiliary capacitor to the output of the current source according to the second clock signal; and V is a predetermined voltage to which the auxiliary capacitor is charged by the current source to mitigate glitching of a voltage across the load impedance when the first switch connects the output of the current source to the load impedance according to the first clock signal.

28. The method of claim 27, further comprising:
periodically connecting and disconnecting the auxiliary capacitor to and from a predetermined voltage source, using a third switch controlled by the first clock signal, when the current source is respectively connected to and disconnected from the load impedance.

* * * * *

UNITED STATES PATENT AND TRADEMARK OFFICE
CERTIFICATE OF CORRECTION

PATENT NO. : 11,451,215 B1
APPLICATION NO. : 17/343084
DATED : September 20, 2022
INVENTOR(S) : Song et al.

It is certified that error appears in the above-identified patent and that said Letters Patent is hereby corrected as shown below:

In the Claims

In Column 19, Line 44, in Claim 13, delete "voltage," and insert -- voltage; --, therefor.

Signed and Sealed this
Twenty-second Day of November, 2022

Katherine Kelly Vidal
Director of the United States Patent and Trademark Office